US009162922B2

(12) United States Patent
Kaneko et al.

(10) Patent No.: US 9,162,922 B2
(45) Date of Patent: *Oct. 20, 2015

(54) GLASS CERAMIC COMPOSITION

(71) Applicant: MURATA MANUFACTURING CO., LTD., Nagaokakyo-shi, Kyoto-Fu (JP)

(72) Inventors: Kazuhiro Kaneko, Nagaokakyo (JP); Sadaaki Sakamoto, Nagaokakyo (JP); Hiroshige Adachi, Nagaokakyo (JP); Satoru Adachi, Nagaokakyo (JP); Seiji Fujita, Nagaokakyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/076,353

(22) Filed: Nov. 11, 2013

(65) Prior Publication Data

US 2014/0066283 A1 Mar. 6, 2014

Related U.S. Application Data

(63) Continuation of application No. PCT/JP2012/053259, filed on Feb. 13, 2012.

(30) Foreign Application Priority Data

May 19, 2011 (JP) ................. 2011-112126

(51) Int. Cl.
*C04B 35/20* (2006.01)
*C04B 35/443* (2006.01)
(Continued)

(52) U.S. Cl.
CPC .............. *C03C 14/008* (2013.01); *B32B 18/00* (2013.01); *C04B 35/20* (2013.01); *C04B 35/443* (2013.01); *C04B 35/462* (2013.01); *H01B 3/12* (2013.01);
(Continued)

(58) Field of Classification Search
CPC ...... C04B 35/20; C04B 35/443; C04B 35/468
USPC .......................................... 501/120, 122, 139
See application file for complete search history.

(56) References Cited

U.S. PATENT DOCUMENTS 8,183,171 B2 * 5/2012 Arashi et al. ................. 501/139
8,426,331 B2 * 4/2013 Toda et al. .................... 501/139
(Continued)

FOREIGN PATENT DOCUMENTS

JP 2002-029827 A 1/2002
JP 2003-063861 A 3/2003
(Continued)

OTHER PUBLICATIONS

PCT/JP2012/053259 Written Opinion dated Apr. 9, 2012.
(Continued)

*Primary Examiner* — Karl Group
(74) *Attorney, Agent, or Firm* — Arent Fox LLP

(57) ABSTRACT

A glass ceramic composition that contains a first ceramic including at least one of $MgAl_2O_4$ and $Mg_2SiO_4$; a second ceramic including BaO, $RE_2O_3$ (RE is a rare-earth element), and $TiO_2$; glass containing each of 44.0 to 69.0 weight % of RO (R is an alkaline-earth metal), 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO; and MnO.

14 Claims, 5 Drawing Sheets

(51) Int. Cl.
*C04B 35/468* (2006.01)
*C03C 14/00* (2006.01)
*H05K 1/03* (2006.01)
*H01B 3/12* (2006.01)
*B32B 18/00* (2006.01)
*C04B 35/462* (2006.01)
*H05K 1/18* (2006.01)
*H05K 3/46* (2006.01)

(52) U.S. Cl.
CPC ...... *H05K 1/0306* (2013.01); *C04B 2235/3206* (2013.01); *C04B 2235/3215* (2013.01); *C04B 2235/3222* (2013.01); *C04B 2235/3224* (2013.01); *C04B 2235/3232* (2013.01); *C04B 2235/3262* (2013.01); *C04B 2235/3281* (2013.01); *C04B 2235/3418* (2013.01); *C04B 2235/3445* (2013.01); *C04B 2235/3481* (2013.01); *C04B 2235/365* (2013.01); *C04B 2235/6025* (2013.01); *C04B 2235/80* (2013.01); *C04B 2237/341* (2013.01); *C04B 2237/343* (2013.01); *C04B 2237/62* (2013.01); *C04B 2237/704* (2013.01); *H05K 1/181* (2013.01); *H05K 3/4629* (2013.01); *H05K 2201/10371* (2013.01)

(56) References Cited

U.S. PATENT DOCUMENTS

| | | | |
|---|---|---|---|
| 8,841,226 B2 * | 9/2014 | Masaoka et al. | 501/139 |
| 2003/0228968 A1 | 12/2003 | Usui et al. | |
| 2008/0297978 A1 | 12/2008 | Ohaga et al. | |
| 2010/0248927 A1 | 9/2010 | Arashi et al. | |
| 2014/0057087 A1 * | 2/2014 | Adachi et al. | 428/212 |
| 2014/0347782 A1 * | 11/2014 | Fujita et al. | 361/301.4 |

FOREIGN PATENT DOCUMENTS

| | | |
|---|---|---|
| JP | 2007-031177 A | 2/2007 |
| JP | 2007-254213 A | 10/2007 |
| JP | 2010-235327 A | 10/2010 |
| WO | WO-03-040057 A1 | 5/2003 |
| WO | WO-2007-086184 A1 | 8/2007 |
| WO | WO-2012-157300 A1 | 11/2012 |

OTHER PUBLICATIONS

PCT/JP2012/053259 ISR dated Apr. 9, 2012.

* cited by examiner

GLASS CERAMIC COMPOSITION

CROSS REFERENCE TO RELATED APPLICATIONS

The present application is a continuation of International application No. PCT/JP2012/053259, filed Feb. 13, 2012, which claims priority to Japanese Patent Application No. 2011-112126, filed May 19, 2011, the entire contents of each of which are incorporated herein by reference.

FIELD OF THE INVENTION

This invention relates to a glass ceramic composition, and in particular, a glass ceramic composition which is able to be fired at a temperature of 1000° C. or lower, and suitable for constituting a glass ceramic substrate for a ceramic electronic component directed to high-frequency applications such as, for example, LC filters.

BACKGROUND OF THE INVENTION

Glass ceramic compositions of interest to this invention include those disclosed in, for example, Japanese Patent Application Laid-Open No. 2002-29827 (Patent Document 1) and Japanese Patent Application Laid-Open No. 2003-63861 (Patent Document 2).

First, Patent Document 1 discloses a composite laminate ceramic electronic component obtained by stacking high-dielectric-constant ceramic layers with a relatively high relative permittivity and low-dielectric-constant ceramic layers with a relatively low relative permittivity, and in particular, as a glass ceramic composition for forming the low-dielectric-constant ceramic layers, discloses, in claim 1 thereof, a glass ceramic composition containing a $MgAl_2O_4$-based ceramic and glass. More particularly, a glass ceramic composition which contains: a $MgAl_2O_4$-based ceramic powder; and a glass powder containing 13 to 50 weight % of silicon oxide in terms of $SiO_2$, 8 to 60 weight % of boron oxide in terms of $B_2O_3$, 0 to 20 weight % of aluminum oxide in terms of $Al_2O_3$, and 10 to 55 weight % of magnesium oxide in terms of MgO is disclosed.

In addition, Patent Document 1 discloses, in claim 2 thereof, an alkaline-earth metal oxide which may be further contained in a proportion of 20 weight % or less, and in claim 6 thereof, the glass content which may preferably be 20 to 80 weight % of the total.

The glass ceramic composition disclosed in Patent Document 1 achieves, in the case of a sintered body thereof, a relatively low relative permittivity such as, for example, 8 or less, and can be thus made suitable for high-frequency applications.

Next, Patent Document 2 discloses a composite laminate ceramic electronic component obtained by stacking high-dielectric-constant ceramic layers with a relatively high relative permittivity and low-dielectric-constant ceramic layers with a relatively low relative permittivity.

In particular, the high-dielectric-constant material constituting the high-dielectric-constant layer includes BaO—$TiO_2$—$RE_2O_3$ (RE is a rare-earth element) based dielectric and glass. The glass contains, according to claim 2 of Patent Document 2, 10 to 25 weight % of $SiO_2$, 10 to 40 weight % of $B_2O_2$, 25 to 55 weight % of MgO, 0 to 20 weight % of ZnO, 0 to 15 weight % of $Al_2O_2$, 0.5 to 10 weight % of $Li_2O$, and 0 to 10 weight % of RO(R is at least one of Ba, Sr, and Ca). In addition, as disclosed in claim 4 of Patent Document 2, the content of the glass is preferably 15 to 35 weight %.

On the other hand, Patent Document 2 discloses a material similar to that in Patent Document 1, as a low-dielectric-constant material constituting the low-dielectric-constant ceramic layers.

The inventors of the present application have first found insulation reliability to be further improved, as a result of making further experiments on the respective glass ceramic compositions described in Patent Documents 1 and 2 mentioned above. The cause is assumed as follows.

The glass contained in the glass ceramic composition disclosed in each of Patent Documents 1 and 2 is intended to allow firing at a temperature of 1000° C. or lower, and adjusted in terms of composition to be likely to be crystallized. In the case of the glass ceramic compositions described in Patent Documents 1 and 2, the glass component and the ceramic component react to deposit crystals in the firing process, and it is thus difficult to stabilize the crystal quantity and the quantity of the glass component at the time of firing completed. Further, this instability of the crystal quantity and the quantity of the glass component at the time of firing completed is assumed to decrease the insulation reliability.

For example, the glass contained in the glass ceramic compositions described in each of Patent Documents 1 and 2 contains a relatively large amount of MgO, this large amount of MgO in the glass is believed to deposit crystals of $MgAl_2O_4$ and/or $Mg_2SiO_4$ from the glass component, and this deposition is assumed to lead to a decrease in insulation reliability.

In addition, in particular, the high-dielectric-constant material described in Patent Document 2 requires the addition of glass in order to allow firing at temperatures of 1000° C. or less, and on the other hand, requires a BaO—$TiO_2$—$RE_2O_3$ based dielectric contained in order to increase the relative permittivity. However, free Ti ions from the BaO—$TiO_2$—$RE_2O_2$ based dielectric cause oxygen defects. Furthermore, these oxygen defects can cause a decrease in insulation reliability in use at high temperature and high voltage for a long period of time, etc.

In addition, the inventors of the present application have recognized, as a result of repeated experiments, problems of the compositions of the respective glass ceramic compositions described in Patent Documents 1 and 2, such as difficulty in stably achieving desired relative permittivity in a wide range from low relative permittivity to high relative permittivity.

More specifically, the glass contained in the glass ceramic compositions described in Patent Documents 1 and 2 is likely to react with the ceramic component to be crystallized in the firing process as described previously. When the crystals are deposited, the relative permittivity is changed, and it is thus difficult to achieve desired relative permittivity.

In addition, the glass contained in the glass ceramic compositions described in Patent Documents 1 and 2 fails to have favorable wettability to $MgAl_2O_4$ based ceramics or BaO—$TiO_2$—$RE_2O_2$ based dielectrics. Therefore, the glass ceramic composition is not able to be sintered, unless a relatively large amount of glass is added. However, the large additive amount of glass will decrease the relative permittivity. Thus, it is difficult to prepare, in particular, high-dielectric-constant materials.

Patent Document 1: Japanese Patent Application Laid-Open No. 2002-29827

Patent Document 2: Japanese Patent Application Laid-Open No. 2003-63861

SUMMARY OF THE INVENTION

Therefore, an object of this invention is to provide a glass ceramic composition which can solve the problems mentioned above, that is, achieve high insulation reliability and desired relative permittivity in a wide range from low relative permittivity to high relative permittivity just by adjusting the composition.

A glass ceramic composition according to this invention contains, in order to solve the technical problems mentioned above:

(1) a first ceramic including at least one of $MgAl_2O_4$ and $Mg_2SiO_4$;

(2) a second ceramic including BaO, $RE_2O_3$ (RE is a rare-earth element, the same shall apply hereafter), and $TiO_2$;

(3) glass containing each of 44.0 to 69.0 weight % of RO (R is at least one alkaline-earth metal selected from Ba, Ca, and Sr), 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO; and (4) MnO.

The glass ceramic composition according to this invention, in order to achieve a low-dielectric-constant material, has a composition containing 47.55 to 69.32 weight % of the first ceramic, containing 6 to 20 weight % of the glass, containing 7.5 to 18.5 weight % of the MnO, and containing, as the second ceramic, each of 0.38 to 1.43 weight % of BaO, 1.33 to 9.5 weight % of $RE_2O_3$, and 0.95 to 6.75 weight % of $TiO_2$. In this first preferred embodiment, attention is drawn to the relatively low content of the glass.

The glass ceramic composition according to the first preferred embodiment can achieve a sintered body that has a relative permittivity of 15 or less, high insulation reliability, a high Qf value, and a temperature coefficient of capacitance (TCC) of 150 ppm/K or lower in terms of absolute value, as can be seen from the experimental examples described later.

The glass ceramic composition according to the first preferred embodiment may further contain 0.23 weight % or less of CuO.

Furthermore, when the glass ceramic composition according to the first preferred embodiment further contains 3 to 20 weight % of a third ceramic including at least one of $Mg_2Al_4Si_5O_{28}$ and $BaAl_2Si_2O_8$, the sintered body can be further reduced in relative permittivity, for example, to 8 or less, and in TCC to 100 ppm/K or lower in terms of absolute value, as can be seen from the experimental examples described later.

The glass ceramic composition containing the third ceramic including at least one of $Mg_2Al_4Si_5O_{28}$ and $BaAl_2Si_2O_8$ as described above may further contain 0.3 weight % or less of CuO.

The composition of a glass ceramic composition according to a second preferred embodiment of this invention is selected so as to achieve a high-dielectric-constant material. A glass ceramic composition according to the second preferred embodiment has a composition containing 1 to 15 weight % of the first ceramic, containing 3 to 15 weight % of the glass, containing 2.3 to 10 weight % of the MnO, and containing, as the second ceramic, each of 2.5 to 15.7 weight % of BaO, 24.6 to 65.3 weight % of $RE_2O_2$, and 11.2 to 36.4 weight % of $TiO_2$. In this second preferred embodiment, attention is also drawn to the relatively low content of the glass.

The glass ceramic composition according to the second preferred embodiment can achieve a sintered body that has a relative permittivity of 30 or more, high insulation reliability, a high Qf value, and a temperature coefficient of capacitance (TCC) of 150 ppm/K or lower in terms of absolute value, as can be seen from the experimental examples described later.

In the second preferred embodiment, 1.2 weight % or less of CuO may be further contained.

The composition of a glass ceramic composition according to a third preferred embodiment of this invention is selected so as to achieve a material that has an intermediate relative permittivity between the low-dielectric-constant material and the high-dielectric-constant material. A glass ceramic composition according to the third preferred embodiment has a composition containing 15.5 to 47 weight % of the first ceramic, containing 7 to 20 weight % of the glass, containing 5.5 to 20.5 weight % of the MnO, and containing, as the second ceramic, each of 2.1 to 5.2 weight % of BaO, 13.2 to 34.75 weight % of $RE_2O_2$, and 9.5 to 24.75 weight % of $TiO_2$. In this third preferred embodiment, attention is also drawn to the relatively low content of the glass.

The glass ceramic composition according to the third preferred embodiment can achieve a sintered body that has high insulation reliability with a relative permittivity in the range of 20 to 25, a high Qf value, and a temperature coefficient of capacitance (TCC) of 60 ppm/K or lower in terms of absolute value, as can be seen from the experimental examples described later.

In the third preferred embodiment, 1.2 weight % or less of CuO may be further contained.

In addition, in the third preferred embodiment, the third ceramic including at least one of $Mg_2Al_4Si_5O_{18}$ and $BaAl_2Si_2O_8$ may be further contained at 7.5 weight % or less.

The glass ceramic composition according to this invention produces the following advantageous effects.

(A) The sintered body is high in terms of insulation reliability, because the glass contained therein is less likely to be crystallized, and MnO is contained therein.

(B) Due to the high wettability and low reactivity of the glass, the glass ceramic composition can be sintered even when the glass component is reduced, whereas the glass ceramic composition is less likely to develop a reaction and stable even when the glass component is increased. Thus, it is possible to broadly adjust the respective contents of the ceramic component and glass component, and a wide range of products from low-dielectric-constant products to high-dielectric-constant products can be easily provided.

DETAILED DESCRIPTION OF THE INVENTION

Figure 1:
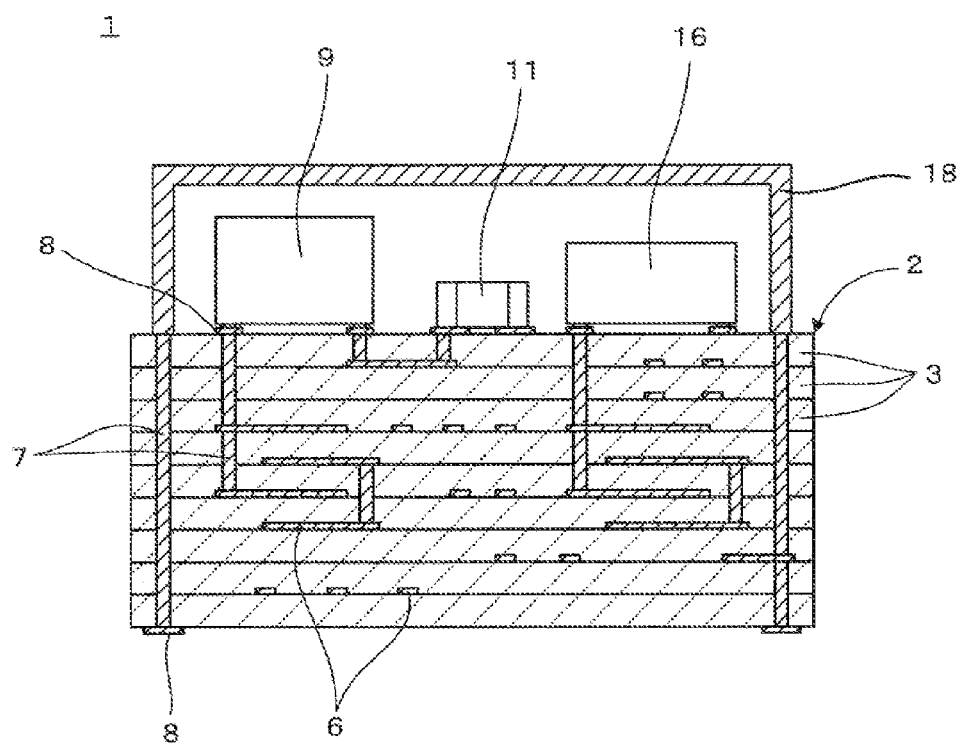
FIG. 1 is a cross-sectional view illustrating a ceramic multilayer module 1 as an example of a laminate-type ceramic electronic component as a use application of a glass ceramic composition according to this invention.

A glass ceramic composition according to this invention containing (1) a first ceramic, (2) a second ceramic, (3) glass, and (4) MnO, is characterized in that:

(1) the first ceramic includes at least one of $MgAl_2O_4$ and $Mg_2SiO_4$;

(2) the second ceramic includes BaO, $RE_2O_3$ and $TiO_2$; and (3) glass contains each of 44.0 to 69.0 weight % of RO (R is at least one alkaline-earth metal selected from Ba, Ca, and Sr, the same shall apply hereafter), 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO.

The glass ceramic composition according to this invention produces the following advantageous effects as is clear from the experimental examples described later.

(A) The sintered body is high in terms of insulation reliability.

The glass has a composition to be less likely to be crystallized. Therefore, the crystal quantity and the glass component quantity are stabilized at the time of firing completed, and the insulation reliability can be thus improved. This is because this glass has a smaller MgO content, as compared with the glass contained in Patent Documents 1 and 2, and thus can suppress the deposition of crystals such as $MgAl_2O_4$ and $Mg_2SiO_4$, and moreover, has an increased RO content, and thus can provide a composition that is not crystallized.

In addition, the glass ceramic composition contains MnO. The compositions disclosed in Patent Documents 1 and 2 contain no MnO. Ti ions produced by the reduction of the Ti oxide can cause oxygen defects, thereby causing a decrease in insulation reliability in use at high temperature and high voltage for a long period of time, etc. In this invention, the substitution of Mn at the Ti site suppresses the generation of oxygen defects. This suppression is also assumed to contribute an improvement in insulation reliability.

(B) Products with a desired relative permittivity can be easily obtained over a wide range from low relative permittivity to high relative permittivity.

As describe previously, the glass disclosed in Patent Documents 1 and 2 is likely to be crystallized by reaction with the ceramic component, and thus likely to undergo a change in relative permittivity. In contrast, the glass contained in the glass ceramic composition according to this invention is less likely to be crystallized, and it is thus easy to prepare products with a desired relative permittivity.

In addition, the glass contained in the glass ceramic composition according to this invention has high wettability on, and low reactivity with the first ceramic and second ceramic described above. Therefore, the glass ceramic composition can be sintered even when the glass component is reduced, whereas the glass ceramic composition is less likely to develop a reaction and stable even when the glass component is increased. Therefore, it is possible to widely adjust the respective contents of the ceramic component and glass component in the glass ceramic composition, and thus, a wide range of products from low-dielectric-constant products to high-dielectric-constant products can be easily provided just by adjusting the respective contents of the ceramic component and glass component.

It is to be noted that the glass ceramic composition according to this invention will not vary significantly in composition between before and after firing. Although $B_2O_3$ and $Li_2O$ in the glass may volatilize during firing in some cases, the proportions of the other constituents after the firing are almost unchanged from those before the firing even in those cases.

A ceramic multilayer module 1 as a use application example of the glass ceramic composition according to this invention will be described with reference to FIGS. 1 and 2.

The ceramic multilayer module 1 includes a multilayer ceramic substrate 2. The multilayer ceramic substrate 2 has a stacked structure composed of a plurality of ceramic layers 3 stacked. The ceramic layers 3 are formed from a glass ceramic sintered body obtained by firing the glass ceramic composition according to this invention.

The multilayer ceramic substrate 2 includes various wiring conductors. The wiring conductors typically include internal conductor films 6 formed along the specific interfaces between the ceramic layers 3, via hole conductors 7 extending to penetrate specific one of the ceramic layers 3, and external conductor films 8 formed on the outer surface of the multilayer ceramic substrate 2.

The upper surface of the multilayer ceramic substrate 2 is mounted with multiple electronic components 9 to 17. Among the electronic components 9 to 17 shown in the figures, for example, the electronic component 9 is a diode, the electronic component 11 is a laminated ceramic capacitor, and the electronic component 16 is a semiconductor IC. These electronic components 9 to 17 constitute circuits required for the ceramic multilayer module 1 along with the wiring conductors formed inside the multilayer ceramic substrate 2, while being electrically connected to specific one of the external conductor films 8 formed on the upper surface of the multilayer ceramic substrate 2.

The upper surface of the multilayer ceramic substrate 2 has a conductive cap 18 fixed thereon for shielding the electronic components 9 to 17. The conductive cap 18 is electrically connected to specific one of the via hole conductors 7 mentioned previously.

Furthermore, the ceramic multilayer module 1 is mounted on a mother board, not shown, with the use of, as a terminal for connection, specific one of the external conductor films 8 formed on the lower surface of the multilayer ceramic substrate 2.

The multilayer ceramic substrate 2 can be manufactured with the use of known co-firing techniques for ceramic laminates.

Specifically, ceramic green sheets for the ceramic layers 3 are first prepared. More specifically, an organic vehicle composed of a binder resin and a solvent is added to the glass ceramic composition according to this invention, thereby providing ceramic slurry. This ceramic slurry is formed into the shape of a sheet by, for example, a doctor blade method, dried, and then punched out into a predetermined size, thereby providing ceramic green sheets. Then, a conductive paste containing, for example, copper or silver as its main constituent is applied in a predetermined pattern to the ceramic green sheets in order to form wiring conductors.

Next, the ceramic green sheets obtained in the way described above are stacked in a predetermined order for a predetermined number of layers, and a pressure is applied then in the thickness direction.

Next, the raw laminated body obtained in the way described above is subjected to firing at a temperature of 1000° C. or lower, for example, 800 to 1000° C., thereby making it possible to obtain the multilayer ceramic substrate 2. In this case, the firing is, in the case of the wiring conductors containing copper as their main constituent, carried out in a non-oxidizing atmosphere such as a nitrogen atmosphere, or in the case of the wiring conductors containing silver as their main constituent, in an oxidizing atmosphere such as the atmosphere.

Next, soldering or the like is applied to the surface of the multilayer ceramic substrate 2 to mount the electronic components 9 to 17 and attach the conductive cap 18, thereby completing the ceramic multilayer module 1.

An LC filter 21 as another use application example of the glass ceramic composition according to this invention will be described with reference to FIGS. 3 through 5.

Figure 3:
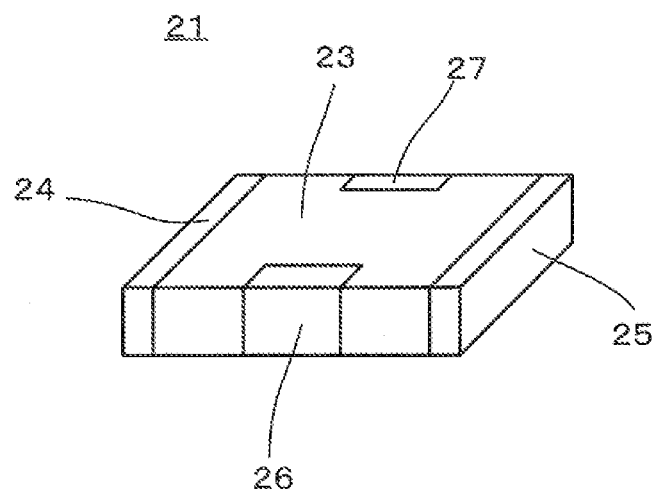
FIG. 3 is a perspective view illustrating the appearance of an LC filter 21 as another example of a laminate-type ceramic electronic component as a use application of a glass ceramic composition according to this invention.

The LC filter 21 includes, as shown in FIG. 3, a component main body 23 as a laminate structure, which is composed of a plurality of ceramic layers stacked, terminal electrodes 24 and 25 are provided on each end of the outer surface of the component main body 23, and terminal electrodes 26 and 27 are provided in the middle portion on each side surface.

Figure 4:
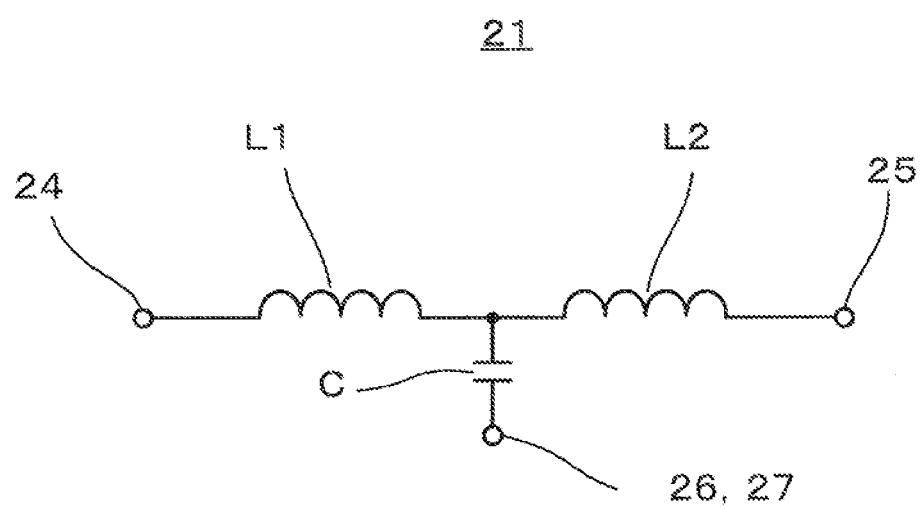
FIG. 4 is an equivalent circuit diagram given by the LC filter 21 shown in FIG. 3.

The LC filter 21 is intended to constitute, as shown in FIG. 4, two parts of inductance L1 and L2 connected in series between the terminal electrodes 24 and 25, and constitute capacitance C between the connecting point of the inductance L1 and L2 and the terminal electrodes 26 and 27.

Figure 5:
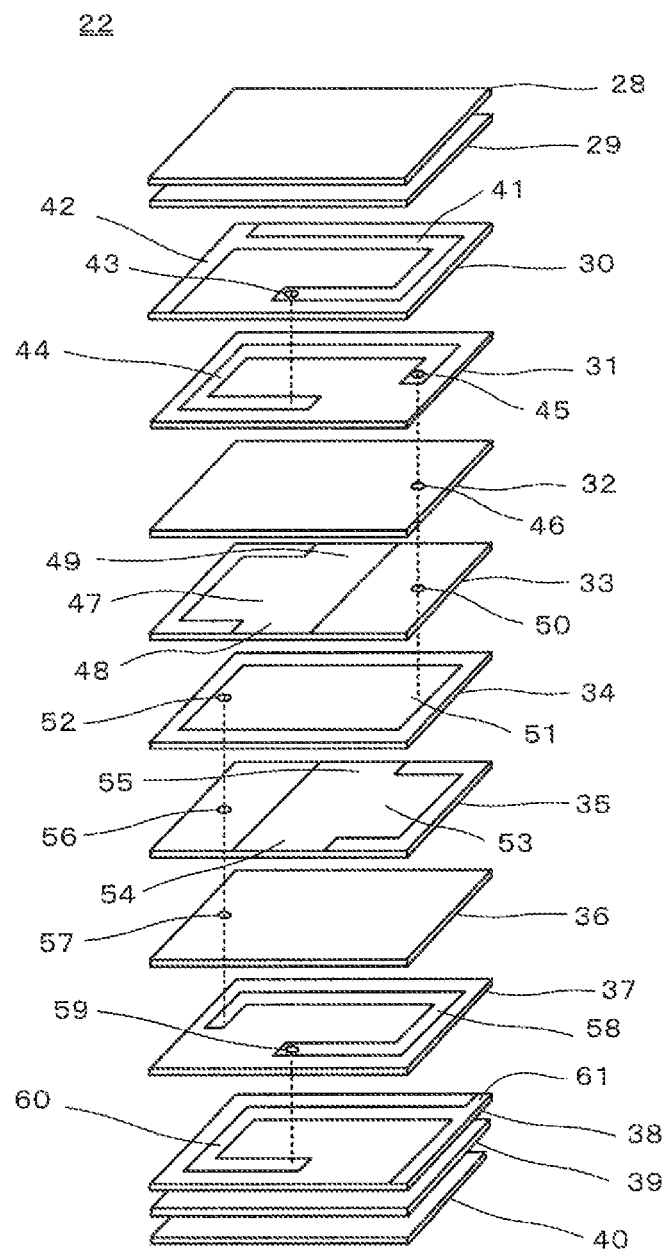
FIG. 5 is a perspective view illustrating, in an exploded form, a raw laminated body 22 as an interim product subjected to a firing step in the manufacture of the LC filter 21 shown in FIG. 3.

The raw laminated body 22 shown in FIG. 5 is supposed to serve as the component main body 23 by firing, and includes ceramic green sheets 28 to 40 stacked. It is to be noted that the number of ceramic green sheets stacked is not limited to the number shown in the figure.

The ceramic green sheets 28 to 40 are each obtained in such a way that an organic vehicle composed of a binder resin and a solvent is added to the glass ceramic composition according to this invention, and the ceramic slurry obtained by mixing these materials is formed into the shape of a sheet by a doctor blade method, dried, and then punched out into a predetermined size.

In addition, in order to provide the inductance L1 and L2 as well as the capacitance C as shown in FIG. 4, wiring conductors are provided in the following manner, in conjunction with specific one of the ceramic green sheets 28 to 40.

On the ceramic green sheet 30, a coil pattern 41 which constitutes a portion of the inductance L1 is formed, and an extraction pattern 42 which extends from one end of the coil pattern 41 is formed, and the other end of the coil pattern 41 is provided with a via hole conductor 43. The extraction pattern 42 is connected to the terminal electrode 24.

On the ceramic green sheet 31, a coil pattern 44 which constitutes a portion of the inductance L1 is formed, and one end of the pattern is provided with a via hole conductor 45. The other end of the coil pattern 44 is connected to the via hole conductor 43 described previously.

The ceramic green sheet 32 is provided with a via hole conductor 46 connected to the via hole conductor 45 described above.

On the ceramic green sheet 33, a capacitor pattern 47 which constitutes a portion of the capacitance C is formed, and extraction patterns 48 and 49 which extend from the capacitor pattern 47 are formed. The extraction patterns 48 and 49 are connected to the terminal electrodes 26 and 27. In addition, the ceramic green sheet 33 is provided with a via hole conductor 50 connected to the via hole conductor 46 described previously.

On the ceramic green sheet 34, a capacitor pattern 51 which constitutes a portion of the capacitance C is formed, and a via hole conductor 52 which is connected to the capacitor pattern 51 is provided. The capacitor pattern 51 is connected to the via hole conductor 50 mentioned previously.

On the ceramic green sheet 35, a capacitor pattern 53 which constitutes a portion of the capacitance C is formed, and extraction patterns 54 and 55 which extend from the capacitor pattern 53 are formed. The extraction patterns 54 and 55 are connected to the terminal electrodes 26 and 27. In addition, the ceramic green sheet 35 is provided with a via hole conductor 56 connected to the via hole conductor 52 described previously.

The ceramic green sheet 36 is provided with a via hole conductor 57 connected to the via hole conductor 56 described above.

On the ceramic green sheet 37, a coil pattern 58 which constitutes a portion of the inductance L2 is formed, and one end of the pattern is provided with a via hole conductor 59. The other end of the coil pattern 58 is connected to the via hole conductor 57 described previously.

On the ceramic green sheet 38, a coil pattern 60 which constitutes a portion of the inductance L2 is formed, and an extraction pattern 61 which extends from one end of the coil pattern 60 is formed. The extraction pattern 61 is connected to the terminal electrode 25. The other end of the coil pattern 60 is connected to the via hole conductor 59 described previously.

For the formation of the above coil patterns 41, 44, 58, and 60, extraction patterns 42, 48, 49, 54, 55, and 61, via hole conductors 43, 45, 46, 50, 52, 56, 57, and 59, as well as capacitor patterns 47, 51, and 53 as wiring conductors, a conductive paste containing, for example, copper or silver as its main constituent is used, and for example, screen printing is applied for the application of the conductive paste.

In order to obtain the raw laminated body 22, the ceramic green sheets 28 to 40 are stacked in the order shown in FIG. 5, and a pressure is applied to the ceramic green sheets in the thickness direction.

Then, the raw laminated body 22 is subjected to firing at a temperature of 1000° C. or lower, for example, 800 to 1000° C., thereby succeeding in obtaining the component main body 23 shown in FIG. 3. In this case, as in the case of the ceramic multilayer module 1 described previously, the firing is, in the case of the wiring conductors containing copper as their main constituent, carried out in a non-oxidizing atmosphere such as a nitrogen atmosphere, or in the case of the wiring conductors containing silver as their main constituent, in an oxidizing atmosphere such as the atmosphere.

Next, the terminal electrodes 24 to 27 are formed on the outer surface of the component main body 23. For the formation of the terminal electrodes 24 to 27, applying and baking a conductive paste containing copper or silver as its main constituent, or a thin-film formation method, such as vapor deposition, plating, or sputtering is used, for example.

In the way described above, the LC filter 21 can be obtained.

Electronic components as use applications of the glass ceramic composition according to this invention are not to be considered limited to the ceramic multilayer module 1 or LC filter 21 as shown. The glass ceramic composition according to this invention can be also applied to various types of multilayer ceramic substrates such as multilayer ceramic substrates for multi-chip modules and multilayer ceramic substrates for hybrid ICs, or various composite electronic components with electronic components mounted on the multilayer ceramic substrates, and furthermore, various chip-type laminated electronic components such as chip-type laminated capacitors and chip-type laminated dielectric antennas.

As described previously, in the glass ceramic composition according to this invention, it is possible to broadly adjust the respective contents of the ceramic component and glass component, and thus, the relative permittivity of the sintered body can be easily adjusted depending on use applications, just by varying the respective contents of the ceramic component and glass component. For example, the ceramic layers 3 in the multilayer ceramic substrate 2 shown in FIGS. 1 and 2 and the ceramic layers included in the component main body 23 of the LC filter 21 shown in FIG. 3 can be easily adjusted for relative permittivity.

The first embodiment is, in order to achieve a low-dielectric-constant material that is relatively low in relative permittivity, preferably adapted to have a composition containing 47.55 to 69.32 weight % of the first ceramic, containing 6 to 20 weight % of the glass, containing 7.5 to 18.5 weight % of the MnO, and containing, as the second ceramic, each of 0.38 to 1.43 weight % of BaO, 1.33 to 9.5 weight % of $RE_2O_3$, and 0.95 to 6.75 weight % of $TiO_2$.

According to the first embodiment, a sintered body which has a relative permittivity of 15 or less, high insulation reliability, a high Qf value, and a temperature coefficient of capacitance (TCC) of 150 ppm/K or lower in terms of absolute value can be obtained, as can be seen from the experimental examples described later.

In the first embodiment, 0.23 weight % or less of CuO may be further contained.

Furthermore, when the glass ceramic composition according to the first embodiment further contains 3 to 20 weight % of a third ceramic including at least one of $Mg_2Al_4Si_5O_{18}$ and $BaAl_2Si_2O_8$, the sintered body can be further reduced in relative permittivity, for example, to 8 or less, and in TCC to 100 ppm/K or lower in terms of absolute value, as can be seen from the experimental examples described later.

The glass ceramic composition containing the third ceramic including at least one of $Mg_2Al_4Si_5O_{18}$ and $BaAl_2Si_2O_8$ as described above may further contain 0.3 weight % or less of CuO.

On the other hand, the second embodiment is, in order to achieve a high-dielectric-constant material that is relatively high in relative permittivity, preferably adapted to have a composition containing 1 to 15 weight % of the first ceramic, containing 3 to 15 weight % of the glass, containing 2.3 to 10 weight % of the MnO, and containing, as the second ceramic, each of 2.5 to 15.7 weight % of BaO, 24.6 to 65.3 weight % of $RE_2O_3$, and 11.2 to 36.4 weight % of $TiO_2$.

According to the second embodiment, a sintered body which has a relative permittivity of 30 or more, high insulation reliability, a high Qf value, and a temperature coefficient of capacitance (TCC) of 150 ppm/K or lower in terms of absolute value can be obtained, as can be seen from the experimental examples described later.

In the second embodiment, 1.2 weight % or less of CuO may be further contained.

As can be seen from the respective properties of the glass ceramic composition according to the first embodiment and of the glass ceramic composition according to the second embodiment, the relative permittivity of the sintered body can be easily adjusted just by varying the compositional ratios of the glass ceramic composition according to this invention. Therefore, for example, in the case of the multilayer ceramic substrate 2 shown in FIGS. 1 and 2, rather than the plurality of ceramic layers 3 included therein all composed of sintered bodies of the same glass ceramic composition, ceramic layers 4 and ceramic layers 5 included therein may be respectively composed of sintered bodies of glass ceramic compositions which differ in relative permittivity, as in the case of a multilayer ceramic substrate 2a included in a ceramic multilayer module 1a shown in FIG. 6.

Figure 2:
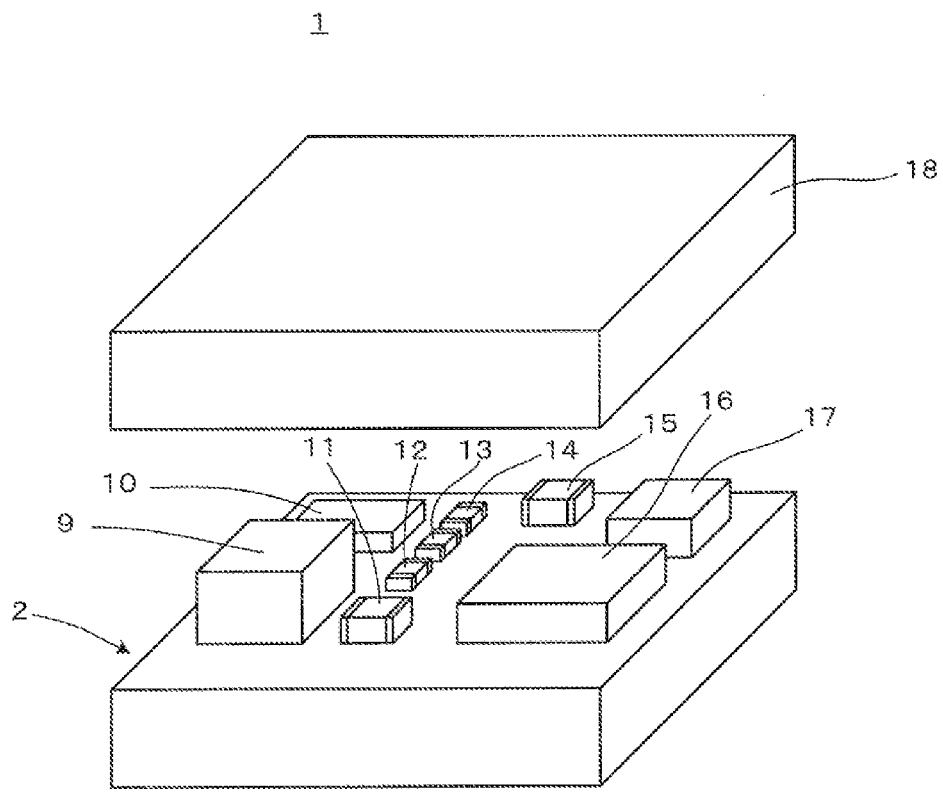
FIG. 2 is a perspective view illustrating the ceramic multilayer module 1 shown in FIG. 1 in an exploded form.
Figure 6:
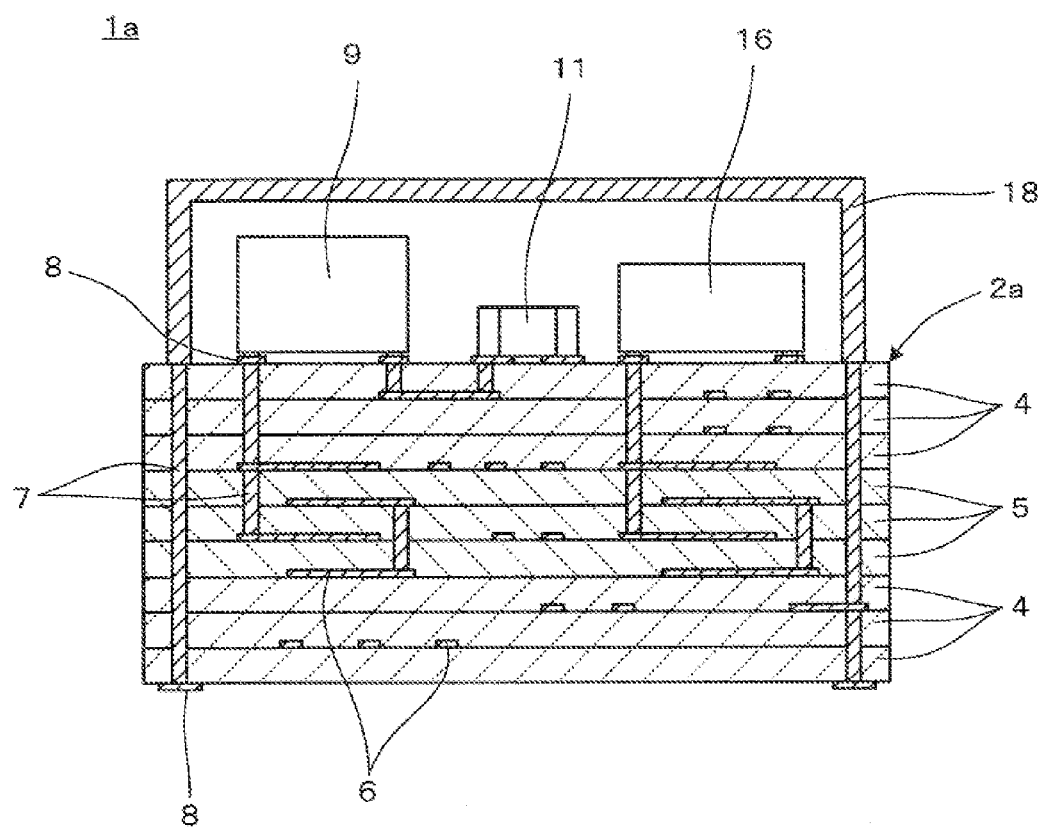
FIG. 6 is a cross-sectional view illustrating a ceramic multilayer module 1a as a modification example of the ceramic multilayer module 1 shown in FIG. 1.

In FIG. 6, the elements corresponding to the elements shown in FIG. 1 are denoted by like reference numerals, and the repeated descriptions of the elements will be omitted.

Referring to FIG. 6, a multilayer ceramic substrate 2a includes low-dielectric-constant ceramic layers 4 and high-dielectric-constant ceramic layers 5, and the plurality of low-dielectric-constant ceramic layers 4 are located to sandwich the plurality of high-dielectric-constant ceramic layers 5.

The low-dielectric-constant ceramic layers 4 are composed of the low-dielectric-constant material which is relatively low in relative permittivity according to the first embodiment described previously, whereas the high-dielectric-constant ceramic layers 5 are composed of the high-dielectric-constant material which is relatively high in relative permittivity according to the second embodiment described previously.

Some of internal conductor films 6 which are provided in conjunction with the high-dielectric-constant ceramic layers 5 are arranged so as to provide electrostatic capacitance, thereby constituting capacitor elements. In this case, the high-dielectric-constant ceramic layers 5 have a relatively high relative permittivity, and thus can acquire high electrostatic capacitance in the capacitor element described above. In addition, the internal conductor films 6 provided in conjunction with the low-dielectric-constant ceramic layers 4 can achieve excellent high-frequency characteristics.

Furthermore, the glass ceramic composition according to the first embodiment which serves as the low-dielectric-constant ceramic layers 4 and the glass ceramic composition according to the second embodiment which serves as the high-dielectric-constant ceramic layers 5 are different from each other only in compositional ratios, with both glass ceramic compositions containing common elements according to this invention, and the low-dielectric-constant ceramic layers 4 and the high-dielectric-constant ceramic layers 5 can be thus sintered by co-firing without any difficulty.

The same also applies to the ceramic layers included in the component main body 23 of the LC filter 21 shown in FIG. 3. To explain with reference to FIG. 5, rather than the preparation of each of the ceramic green sheets 28 to 40 with the use of the same glass ceramic composition, among the ceramic green sheets 28 to 40, the ceramic green sheets 33 and 34 which make a direct contribution to the formation of the capacitance C may use the glass ceramic composition according to the second embodiment, whereas the other ceramic green sheets 28 to 32 and 35 to 40 may be prepared with the use of the glass ceramic composition according to the first embodiment. This can acquire high electrostatic capacitance in the capacitance C. In addition, excellent high-frequency characteristics can be achieved in the inductance L1 and L2.

Furthermore, the third embodiment is, in order to achieve a material with a medium relative permittivity between the low-dielectric-constant material according to the first embodiment and the high-dielectric-constant material according to the second embodiment, preferably adapted to have a composition containing 15.5 to 47 weight % of the first ceramic, containing 7 to 20 weight % of the glass, containing 5.5 to 20.5 weight % of the MnO, and containing, as the second ceramic, each of 2.1 to 5.2 weight % of BaO, 13.2 to 34.75 weight % of $RE_2O_3$, and 9.5 to 24.75 weight % of $TiO_2$.

According to the third embodiment, a sintered body which has a relative permittivity in the range of 20 to 25, high insulation reliability, a high Qf value, and a temperature coefficient of capacitance (TCC) of 60 ppm/K or lower in terms of absolute value can be obtained, as can be seen from the experimental examples described later.

In the third embodiment, 1.2 weight % or less of CuO may be further contained.

In addition, in the third preferred embodiment, the third ceramic including at least one of $Mg_2Al_4Si_5O_{18}$ and $BaAl_2Si_2O_8$ may be further contained at 7.5 weight % or less.

Next, the experimental examples which were carried out for confirming properties obtained from the glass ceramic composition according to this invention, and figuring out the scope of this invention, or more preferred ranges thereof for the glass ceramic composition will be described.

[Preparation of Glass]

First, as glass contained in the glass ceramic composition and used commonly in the following experimental examples, compositions blended as shown in Table 1 were melted at a temperature of 1100 to 1400° C., rapidly cooled for vitrification, and then subjected to wet grinding to prepare glass powders of various compositions.

TABLE 1

| Symbol for Glass | $Li_2O$ (weight %) | BaO (weight %) | SrO (weight %) | CaO (weight %) | MgO (weight %) | $SiO_2$ (weight %) | $B_2O_3$ (weight %) | $Al_2O_3$ (weight %) | Total of Alkaline-Earth Metal (weight %) |
|---|---|---|---|---|---|---|---|---|---|
| G1  | 0.2 | 45   | 6.5  | 2.5 | 0.5 | 28.2 | 15.1 | 2   | 54 |
| G2  | 0.3 | 45   | 6.5  | 2.5 | 0.5 | 27.7 | 15.5 | 2   | 54 |
| G3  | 2   | 45   | 6.5  | 2.5 | 0.5 | 26.5 | 15   | 2   | 54 |
| G4  | 7.5 | 43.5 | 6    | 2   | 0.5 | 24   | 14.5 | 2   | 51.5 |
| G5  | 8   | 43   | 6    | 2   | 0.5 | 23.5 | 15   | 2   | 51 |
| G6  | 2.6 | 28   | 12.9 | 4   | 0.5 | 30   | 20   | 2   | 44.9 |
| G7  | 2.6 | 46.5 | 8    | 0.4 | 0.5 | 25.2 | 14.8 | 2   | 54.9 |
| G8  | 3.2 | 31.4 | 3.8  | 2.3 | 5.5 | 29.8 | 20   | 4   | 37.5 |
| G9  | 2.6 | 30   | 15   | 3.3 | 5.5 | 24.6 | 17   | 2   | 48.3 |
| G10 | 2.6 | 49   | 7.9  | 2.5 | 0.5 | 20.5 | 15   | 2   | 59.4 |
| G11 | 2.6 | 57   | 6.2  | 2.5 | 0.5 | 18.8 | 10.4 | 2   | 65.7 |
| G12 | 2.6 | 60   | 6.4  | 2.5 | 0.8 | 15   | 10.7 | 2   | 68.9 |
| G13 | 2.6 | 48.9 | 15.8 | 4.8 | 0.5 | 14.6 | 10.8 | 2   | 69.5 |
| G14 | 2.6 | 46.8 | 18.5 | 3.7 | 0.5 | 14.8 | 11.1 | 2   | 69 |
| G15 | 2.6 | 46.7 | 8.5  | 4.5 | 0.5 | 26.2 | 9    | 2   | 59.7 |
| G16 | 2.6 | 45   | 9    | 2.5 | 0.1 | 25.5 | 13.3 | 2   | 56.5 |
| G17 | 2.6 | 42   | 5.4  | 2.5 | 0.5 | 32   | 13   | 2   | 49.9 |
| G18 | 2.6 | 44.5 | 1.6  | 4.4 | 0.8 | 24.3 | 19.8 | 2   | 50.5 |
| G19 | 2.6 | 41.4 | 6.5  | 2   | 0.5 | 23.5 | 21.5 | 2   | 49.9 |
| G20 | 2.6 | 44   | 3.5  | 2.5 | 0.1 | 24.7 | 18.6 | 4   | 50 |
| G21 | 2.6 | 43.7 | 5    | 3.5 | 4   | 23.3 | 17.4 | 0.5 | 52.2 |
| G22 | 2.6 | 47   | 6.5  | 2.5 | 0.5 | 23.4 | 15   | 2.5 | 56 |
| G23 | 2.6 | 35.8 | 7.7  | 0.5 | 4   | 27.6 | 18.8 | 3   | 44 |
| G24 | 2.6 | 44.7 | 6    | 5   | 2.5 | 22   | 15   | 2.2 | 55.7 |
| G25 | 2.6 | 46.9 | 1    | 2.8 | 0.8 | 27.6 | 16.3 | 2   | 50.7 |
| G26 | 2.6 | 40.2 | 20   | 2.5 | 0.5 | 19.8 | 12.4 | 2   | 62.7 |
| G27 | 2.6 | 44.9 | 6    | 2   | 0.5 | 30   | 12   | 2   | 52.9 |
| G28 | 2.6 | 45.5 | 11.8 | 3.8 | 0.5 | 14.2 | 18.8 | 2.8 | 61.1 |
| G29 | 2.6 | 45.4 | 7.5  | 3.5 | 0.5 | 28.5 | 10   | 2   | 56.4 |
| G30 | 2.6 | 45.2 | 7.1  | 3.1 | 0.5 | 19.5 | 20   | 2   | 55.4 |
| G31 | 2.6 | 46.5 | 6.7  | 5.5 | 0.5 | 22.8 | 13.4 | 2   | 58.7 |
| G32 | 2.6 | 45   | 6.7  | 2.7 | 0   | 25.5 | 15.5 | 2   | 54.4 |
| G33 | 2.6 | 43.6 | 6.3  | 2.2 | 6.5 | 22.2 | 14.6 | 2   | 52.1 |
| G34 | 2.6 | 43.8 | 11.2 | 4.7 | 4.8 | 11.4 | 19.5 | 2   | 59.7 |
| G35 | 2.6 | 46.4 | 7.8  | 3.9 | 0.5 | 24.5 | 14   | 0.3 | 58.1 |
| G36 | 2.6 | 45   | 6.5  | 2.5 | 0.5 | 24.4 | 13.5 | 5   | 54 |

Experimental Example 1

In Experimental Example 1, dielectric materials were prepared which were relatively low in dielectric constant.

First, as the first ceramic, $MgCO_3$ and $Al_2O_3$ were blended in predetermined proportions, and subjected to calcination and wet grinding to prepare a spinel compound: $MgAl_2O_4$, and $MgCO_3$ and $SiO_2$ were blended in predetermined proportions, and subjected to calcination and wet grinding to prepare a forsterite compound: $Mg_2SiO_4$.

Next, for the compositions shown in Tables 2 and 3, respective powders of the glass shown in Table 1, $MgAl_2O_4$, $Mg_2SiO_4$, BaO, $TiO_2$, $Nd_2O_3$ and $Sm_2O_3$ as $RE_2O_3$, MnO, and CuO were blended and mixed, and an organic solvent and a binder were then added to the mixture to prepare slurry.

TABLE 2

| Sample Number | Glass Symbol | Glass (weight %) | First Ceramic (weight %) | | Second Ceramic (weight %) | | | | MnO (weight %) | CuO (weight %) |
|---|---|---|---|---|---|---|---|---|---|---|
| | | | $MgAl_2O_4$ | $Mg_2SiO_4$ | BaO | $TiO_2$ | $Nd_2O_3$ | $Sm_2O_3$ | | |
| 1  | G1  | 13 | 0     | 61.92 | 0.8 | 3.8 | 5.4 | 0 | 15 | 0.08 |
| 2  | G1  | 13 | 61.92 | 0     | 0.8 | 3.8 | 5.4 | 0 | 15 | 0.08 |
| 3  | G2  | 13 | 0     | 61.92 | 0.8 | 3.8 | 5.4 | 0 | 15 | 0.08 |
| 4  | G3  | 13 | 0     | 61.92 | 0.8 | 3.8 | 5.4 | 0 | 15 | 0.08 |
| 5  | G4  | 13 | 0     | 61.92 | 0.8 | 3.8 | 5.4 | 0 | 15 | 0.08 |
| 6  | G5  | 13 | 0     | 61.92 | 0.8 | 3.8 | 5.4 | 0 | 15 | 0.08 |
| 7  | G5  | 13 | 61.92 | 0     | 0.8 | 3.8 | 5.4 | 0 | 15 | 0.08 |
| 8  | G6  | 13 | 0     | 61.92 | 0.8 | 3.8 | 5.4 | 0 | 15 | 0.08 |
| 9  | G6  | 13 | 61.92 | 0     | 0.8 | 3.8 | 5.4 | 0 | 15 | 0.08 |
| 10 | G7  | 13 | 0     | 61.92 | 0.8 | 3.8 | 5.4 | 0 | 15 | 0.08 |
| 11 | G8  | 13 | 0     | 61.92 | 0.8 | 3.8 | 5.4 | 0 | 15 | 0.08 |
| 12 | G8  | 13 | 61.92 | 0     | 0.8 | 3.8 | 5.4 | 0 | 15 | 0.08 |
| 13 | G9  | 13 | 0     | 61.92 | 0.8 | 3.8 | 5.4 | 0 | 15 | 0.08 |
| 14 | G9  | 13 | 61.92 | 0     | 0.8 | 3.8 | 5.4 | 0 | 15 | 0.08 |
| 15 | G10 | 13 | 0     | 61.92 | 0.8 | 3.8 | 5.4 | 0 | 15 | 0.08 |

TABLE 2-continued

| Sample Number | Glass Symbol | (weight %) | First Ceramic (weight %) | | Second Ceramic (weight %) | | | | MnO (weight %) | CuO (weight %) |
|---|---|---|---|---|---|---|---|---|---|---|
| | | | MgAl$_2$O$_4$ | Mg$_2$SiO$_4$ | BaO | TiO$_2$ | RE$_2$O$_3$ | | | |
| | | | | | | | Nd$_2$O$_3$ | Sm$_2$O$_3$ | | |
| 16 | G11 | 13 | 0 | 61.92 | 0.8 | 3.8 | 5.4 | 0 | 15 | 0.08 |
| 17 | G12 | 13 | 0 | 61.92 | 0.8 | 3.8 | 5.4 | 0 | 15 | 0.08 |
| 18 | G13 | 13 | 0 | 61.92 | 0.8 | 3.8 | 5.4 | 0 | 15 | 0.08 |
| 19 | G14 | 13 | 0 | 61.92 | 0.8 | 3.8 | 5.4 | 0 | 15 | 0.08 |
| 20 | G15 | 13 | 0 | 61.92 | 0.8 | 3.8 | 5.4 | 0 | 15 | 0.08 |
| 21 | G16 | 13 | 0 | 61.92 | 0.8 | 3.8 | 5.4 | 0 | 15 | 0.08 |
| 22 | G17 | 13 | 0 | 61.92 | 0.8 | 3.8 | 5.4 | 0 | 15 | 0.08 |
| 23 | G18 | 13 | 0 | 61.92 | 0.8 | 3.8 | 5.4 | 0 | 15 | 0.08 |
| 24 | G19 | 13 | 0 | 61.92 | 0.8 | 3.8 | 5.4 | 0 | 15 | 0.08 |
| 25 | G20 | 13 | 0 | 61.92 | 0.8 | 3.8 | 5.4 | 0 | 15 | 0.08 |
| 26 | G21 | 13 | 0 | 61.92 | 0.8 | 3.8 | 5.4 | 0 | 15 | 0.08 |
| 27 | G22 | 13 | 0 | 61.92 | 0.8 | 3.8 | 5.4 | 0 | 15 | 0.08 |
| 28 | G22 | 13 | 61.92 | 0 | 0.8 | 3.8 | 5.4 | 0 | 15 | 0.08 |
| 29 | G23 | 13 | 0 | 61.92 | 0.8 | 3.8 | 5.4 | 0 | 15 | 0.08 |
| 30 | G23 | 13 | 61.92 | 0 | 0.8 | 3.8 | 5.4 | 0 | 15 | 0.08 |
| 31 | G24 | 13 | 0 | 61.92 | 0.8 | 3.8 | 5.4 | 0 | 15 | 0.08 |
| 32 | G25 | 13 | 0 | 61.92 | 0.8 | 3.8 | 5.4 | 0 | 15 | 0.08 |
| 33 | G26 | 13 | 0 | 61.92 | 0.8 | 3.8 | 5.4 | 0 | 15 | 0.08 |
| 34 | G27 | 13 | 0 | 61.92 | 0.8 | 3.8 | 5.4 | 0 | 15 | 0.08 |
| 35 | G28 | 13 | 0 | 61.92 | 0.8 | 3.8 | 5.4 | 0 | 15 | 0.08 |
| 36 | G29 | 13 | 0 | 61.92 | 0.8 | 3.8 | 5.4 | 0 | 15 | 0.08 |
| 37 | G30 | 13 | 0 | 61.92 | 0.8 | 3.8 | 5.4 | 0 | 15 | 0.08 |
| 38 | G31 | 13 | 0 | 61.92 | 0.8 | 3.8 | 5.4 | 0 | 15 | 0.08 |
| 39 | G32 | 13 | 0 | 61.92 | 0.8 | 3.8 | 5.4 | 0 | 15 | 0.08 |
| 40 | G32 | 13 | 61.92 | 0 | 0.8 | 3.8 | 5.4 | 0 | 15 | 0.08 |
| 41 | G33 | 13 | 0 | 61.92 | 0.8 | 3.8 | 5.4 | 0 | 15 | 0.08 |
| 42 | G33 | 13 | 61.92 | 0 | 0.8 | 3.8 | 5.4 | 0 | 15 | 0.08 |
| 43 | G34 | 13 | 0 | 61.92 | 0.8 | 3.8 | 5.4 | 0 | 15 | 0.08 |
| 44 | G34 | 13 | 61.92 | 0 | 0.8 | 3.8 | 5.4 | 0 | 15 | 0.08 |
| 45 | G35 | 13 | 0 | 61.92 | 0.8 | 3.8 | 5.4 | 0 | 15 | 0.08 |
| 46 | G35 | 13 | 61.92 | 0 | 0.8 | 3.8 | 5.4 | 0 | 15 | 0.08 |
| 47 | G36 | 13 | 0 | 61.92 | 0.8 | 3.8 | 5.4 | 0 | 15 | 0.08 |
| 48 | G36 | 13 | 61.92 | 0 | 0.8 | 3.8 | 5.4 | 0 | 15 | 0.08 |

TABLE 3

| Sample Number | Glass Symbol | (weight %) | First Ceramic (weight %) | | Second Ceramic (weight %) | | | | MnO (weight %) | CuO (weight %) |
|---|---|---|---|---|---|---|---|---|---|---|
| | | | MgAl$_2$O$_4$ | Mg$_2$SiO$_4$ | BaO | TiO$_2$ | RE$_2$O$_3$ | | | |
| | | | | | | | Nd$_2$O$_3$ | Sm$_2$O$_3$ | | |
| 49 | G22 | 15 | 0 | 64.92 | 0.35 | 1.9 | 2.75 | 0 | 15 | 0.08 |
| 50 | G22 | 17 | 0 | 68.12 | 0.8 | 3.5 | 6 | 0 | 4.5 | 0.08 |
| 51 | G22 | 12 | 0 | 69.32 | 0.38 | 2 | 2.75 | 0 | 13.5 | 0.05 |
| 52 | G22 | 15 | 0 | 64.4 | 0.6 | 3.5 | 4.5 | 0 | 12 | 0 |
| 53 | G22 | 15 | 63.45 | 0 | 0.75 | 3.5 | 5.25 | 0 | 12 | 0.05 |
| 54 | G22 | 5 | 0 | 59.42 | 1.4 | 6.6 | 9.5 | 0 | 18 | 0.08 |
| 55 | G22 | 12 | 0 | 60.42 | 1.4 | 6.6 | 9.5 | 0 | 10 | 0.08 |
| 56 | G22 | 12 | 52.75 | 14.4 | 0.75 | 3.45 | 4.55 | 0 | 12 | 0.1 |
| 57 | G22 | 12 | 0 | 69.55 | 0.52 | 2.63 | 4.27 | 0 | 11 | 0.03 |
| 58 | G22 | 15.5 | 0 | 63.5 | 0.4 | 0.9 | 1.5 | 0 | 18 | 0.2 |
| 59 | G22 | 13 | 0 | 61.92 | 0.8 | 3.8 | 5.4 | 0 | 15 | 0.08 |
| 60 | G22 | 10 | 0 | 62.13 | 1.42 | 6.75 | 9.5 | 0 | 10 | 0.2 |
| 61 | G22 | 19 | 0 | 63.24 | 0.4 | 0.95 | 1.33 | 0 | 15 | 0.08 |
| 62 | G22 | 20 | 0 | 57.17 | 0.4 | 1.8 | 2.6 | 0 | 18 | 0.03 |
| 63 | G22 | 13 | 61.92 | 0 | 0.8 | 3.8 | 5.4 | 0 | 15 | 0.08 |
| 64 | G22 | 6 | 0 | 61.55 | 1.4 | 6.5 | 9.5 | 0 | 15 | 0.05 |
| 65 | G22 | 14 | 0 | 68.42 | 0.8 | 3.8 | 0 | 5.4 | 7.5 | 0.08 |
| 66 | G22 | 13 | 0 | 61.92 | 0.8 | 3.8 | 0 | 5.4 | 15 | 0.08 |
| 67 | G22 | 14 | 60.92 | 0 | 0.8 | 3.8 | 0 | 5.4 | 15 | 0.08 |
| 68 | G22 | 17 | 0 | 47.55 | 1.405 | 6.575 | 9.265 | 0 | 18 | 0.205 |
| 69 | G22 | 12.5 | 0 | 61.705 | 1.415 | 6.7 | 10 | 0 | 7.5 | 0.18 |
| 70 | G22 | 12.5 | 0 | 60.32 | 1.43 | 6.7 | 9.45 | 0 | 9.5 | 0.1 |
| 71 | G22 | 15.5 | 0 | 60.15 | 1.2 | 5.65 | 7.77 | 0 | 9.5 | 0.23 |
| 72 | G22 | 11.75 | 0 | 61.87 | 1.5 | 6.7 | 9.25 | 0 | 8.85 | 0.08 |
| 73 | G22 | 20.5 | 0 | 60.37 | 0.75 | 3.35 | 4.45 | 0 | 10.5 | 0.08 |
| 74 | G22 | 10.75 | 0 | 61.38 | 1.42 | 6.75 | 0 | 9.5 | 10 | 0.2 |

TABLE 3-continued

| Sample Number | Glass Symbol | Glass (weight %) | First Ceramic (weight %) MgAl$_2$O$_4$ | First Ceramic (weight %) Mg$_2$SiO$_4$ | Second Ceramic (weight %) BaO | Second Ceramic (weight %) TiO$_2$ | Second Ceramic (weight %) RE$_2$O$_3$ Nd$_2$O$_3$ | Second Ceramic (weight %) RE$_2$O$_3$ Sm$_2$O$_3$ | MnO (weight %) | CuO (weight %) |
|---|---|---|---|---|---|---|---|---|---|---|
| 75 | G22 | 19 | 63.24 | 0 | 0.4 | 0.95 | 0 | 1.33 | 15 | 0.08 |
| 76 | G22 | 10.5 | 0 | 60.495 | 1.425 | 6.8 | 9.45 | 0 | 11.25 | 0.08 |
| 77 | G22 | 10 | 0 | 61.2 | 0.75 | 3.5 | 4.5 | 0 | 20 | 0.05 |
| 78 | G22 | 12 | 0 | 61.35 | 1.35 | 6.25 | 8.75 | 0 | 10 | 0.3 |
| 79 | G22 | 12.45 | 69.32 | 0 | 0.39 | 2.125 | 2.815 | 0 | 12.85 | 0.05 |
| 80 | G22 | 16.81 | 47.55 | 0 | 1.405 | 6.575 | 9.265 | 0 | 18.2 | 0.195 |
| 81 | G22 | 11.55 | 0 | 60.27 | 0.75 | 3.6 | 5.25 | 0 | 18.5 | 0.08 |
| 82 | G22 | 16.8 | 0 | 61.55 | 1.43 | 0.97 | 1.3 | 0 | 17.9 | 0.05 |
| 83 | G22 | 16.55 | 0 | 47.5 | 1.415 | 6.725 | 9.45 | 0 | 18.18 | 0.18 |
| 84 | G22 | 12 | 69.5 | 0 | 0.5 | 2.7 | 4.25 | 0 | 11 | 0.05 |
| 85 | G22 | 16.55 | 47.455 | 0 | 1.415 | 6.75 | 9.45 | 0 | 18.2 | 0.18 |
| 86 | G22 | 10.5 | 0 | 61.7 | 1.42 | 6.7 | 0 | 10 | 9.5 | 0.18 |
| 87 | G22 | 16.8 | 0 | 62.58 | 0.4 | 0.97 | 0 | 1.3 | 17.9 | 0.05 |

Next, the slurry was formed into the shape of a sheet by a doctor blade method, and dried to obtain ceramic green sheets. The ceramic green sheets were used to prepare samples appropriately, and the relative permittivity ($\epsilon_r$), Qf, temperature coefficient of capacitance (β), and insulation reliability were evaluated as shown in Tables 4 and 5.

More specifically, for the measurement of $\epsilon_r$ and Qf, the ceramic green sheets were cut, stacked, and subjected to pressure bonding to prepare pressure-bonded bodies of 0.6 mm×50 mm×50 mm in dimensions. These bodies were subjected to firing at a temperature of 990° C. to obtain ceramic substrates as samples. These ceramic substrates were used to measure $\epsilon_r$ and Qf by a cavity resonator method. In this case, the measurement frequency was adjusted to approximately 25 GHz.

This experimental example was aimed at obtaining a dielectric material with $\epsilon_r$ of 15 or less. The sample with Qf less than 5000 was determined as a failure.

For the measurement of β and the evaluation on insulation reliability, after cutting the ceramic green sheets, a conductive paste containing Cu was printed onto the ceramic green sheets in order to form internal electrodes, and then through each step of stacking, pressure bonding, firing, and external electrode formation, laminated ceramic capacitors were obtained as samples. In the laminated ceramic capacitors, the distance between adjacent internal electrodes was 10 μm, and the area of the electrodes overlapped with each other was 4 mm□.

Then, for the laminated ceramic capacitors, the electrostatic capacitance was measured in the range of −40° C. to 85° C. to obtain temperature coefficient of capacitance β with 20° C. regarded as a standard. The sample with β in excess of 150 ppm/K in terms of absolute value was determined as a failure.

In addition, for the laminated ceramic capacitors, the insulation resistance was measured after a test of applying DC 200 V for 100 hours under a temperature of 150° C., the capacitor with log (IR [Ω]) less than 11 after this test was determined as a failure, which is indicated by "B" in the column "Insulation Reliability" in Tables 4 and 5, whereas the capacitor with log (IR [Ω]) of 11 or more was determined as a pass, which is indicated by "A" in the column "Insulation Reliability" in Tables 4 and 5.

It is to be noted that the insufficiently sintered sample is shown as "Unsintered" in the column of "Remarks" in Tables 4 and 5, whereas the sample with the glass unvitrified is shown as "Unvitrified" in the column of "Remarks", and these samples were not evaluated for each of $\epsilon_r$, Qf, β, and insulation reliability. In addition, the reasons for the failures are briefly described in the column of "Remarks" for the failed samples in this experimental example.

TABLE 4

| Sample Number | εr | Qf (GHz) | β (ppm/K) | Insulation Reliability | Remarks |
|---|---|---|---|---|---|
| 1* | — | — | — | — | Unsintered |
| 2* | — | — | — | — | Unsintered |
| 3 | 10 | 6300 | 125 | A | |
| 4 | 11 | 6000 | 111 | A | |
| 5 | 12 | 6300 | 135 | A | |
| 6* | 12 | 5500 | 133 | B | Decreased Insulation Reliability |
| 7* | 13 | 5300 | 136 | B | Decreased Insulation Reliability |
| 8 | 15 | 5100 | 149 | A | |
| 9 | 13 | 5100 | 149 | A | |
| 10 | 10 | 5700 | 149 | B | |
| 11* | 15 | 5300 | 672 | A | Deteriorated β |
| 12* | 13 | 5100 | 660 | A | Deteriorated β |
| 13 | 11 | 6000 | 136 | A | |
| 14 | 10 | 5800 | 128 | A | |
| 15 | — | 5300 | 112 | A | |
| 16 | 12 | 6600 | 121 | A | |
| 17 | 12 | 5100 | 128 | A | |
| 18* | — | — | — | — | Unsintered |
| 19 | 11 | 6100 | 128 | A | |
| 20* | — | — | — | — | Unsintered |
| 21 | 10 | 6000 | 126 | A | |
| 22* | — | — | — | — | Unsintered |
| 23 | 10 | 6000 | 122 | A | |
| 24* | 12 | 5200 | 133 | B | Decreased Insulation Reliability |
| 25 | 13 | 6400 | 132 | A | |
| 26 | 11 | 5400 | 112 | A | |
| 27 | 9 | 7900 | 112 | A | |
| 28 | 10 | 7800 | 114 | A | |
| 29 | 12 | 6400 | 133 | A | |
| 30 | 12 | 5500 | 139 | A | |
| 31 | 11 | 6800 | 122 | A | |
| 32 | 14 | 5400 | 149 | A | |
| 33 | 12 | 5100 | 128 | A | |
| 34 | 11 | 6100 | 114 | A | |
| 35 | 10 | 5400 | 121 | A | |
| 36 | 11 | 6000 | 128 | A | |
| 37 | 10 | 6000 | 133 | A | |
| 38 | 12 | 5600 | 149 | A | |
| 39* | 12 | 5500 | 870 | A | Deteriorated β |
| 40* | 12 | 5300 | 945 | A | Deteriorated β |
| 41* | 11 | 5300 | 135 | B | Decreased Insulation Reliability |
| 42* | 15 | 5100 | 136 | B | Decreased Insulation Reliability |

TABLE 4-continued

| Sample Number | ∈r | Qf (GHz) | β (ppm/K) | Insulation Reliability | Remarks |
|---|---|---|---|---|---|
| 43* | — | — | — | — | Unvitrified |
| 44* | — | — | — | — | Unvitrified |
| 45* | 11 | 6300 | 125 | B | Decreased Insulation Reliability |
| 46* | 13 | 5500 | 130 | B | Decreased Insulation Reliability |
| 47* | 10 | 5500 | 131 | B | Decreased Insulation Reliability |
| 48* | 14 | 5100 | 135 | B | Decreased Insulation Reliability |

TABLE 5

| Sample Number | ∈r | Qf (GHz) | β (ppm/K) | Insulation Reliability | Remarks |
|---|---|---|---|---|---|
| 49* | 10 | 6300 | 720 | A | Deteriorated β |
| 50* | — | — | — | — | Unsintered |
| 51 | 11 | 7200 | 148 | A | |
| 52 | 10 | 5200 | 145 | A | |
| 53 | 8 | 7800 | 140 | A | |
| 54* | — | — | — | — | Unsintered |
| 55 | 15 | 6800 | 114 | A | |
| 56 | 12 | 6200 | 126 | A | |
| 57* | 9 | 6000 | 175 | A | Deteriorated β |
| 58* | 9 | 5800 | 692 | B | Deteriorated β |
| 59 | 9 | 8000 | 110 | A | |
| 60 | 15 | 7000 | 115 | A | |
| 61 | 8 | 6800 | 142 | A | |
| 62 | 9 | 5400 | 132 | A | |
| 63 | 11 | 5800 | 138 | A | |
| 64 | 14 | 6300 | 135 | A | |
| 65 | 13 | 5700 | 128 | A | |
| 66 | 9 | 6100 | 125 | A | |
| 67 | 12 | 5400 | 132 | A | |
| 68 | 13 | 5700 | 130 | A | |
| 69* | 12 | 6500 | 135 | B | Decreased Insulation Reliability |
| 70 | 12 | 6400 | 146 | A | |
| 71 | 9 | 5400 | 146 | A | |
| 72* | 12 | 6000 | 146 | B | Decreased Insulation Reliability |
| 73* | 10 | 6000 | 144 | B | Decreased Insulation Reliability |
| 74 | 12 | 7400 | 138 | A | |
| 75 | 10 | 5300 | 141 | A | |
| 76* | 12 | 5300 | 140 | B | Decreased Insulation Reliability |
| 77* | 11 | 5300 | 175 | A | Deteriorated β |
| 78* | 12 | 5200 | 146 | B | Decreased Insulation Reliability |
| 79 | 9 | 7200 | 147 | A | |
| 80 | 13 | 5400 | 140 | A | |
| 81 | 9 | 6500 | 148 | A | |
| 82* | 9 | 6600 | 250 | A | Deteriorated β |
| 83* | 14 | 4600 | 180 | A | Decreased Qf |
| 84* | 9 | 5200 | 195 | A | Deteriorated β |
| 85* | 12 | 4100 | 150 | A | Decreased Qf |
| 86* | 12 | 5500 | 140 | B | Decreased Insulation Reliability |
| 87* | 10 | 5200 | 285 | A | Deteriorated β |

In Tables 4 and 5, the sample numbers are marked with * for the samples determined as failures in this experimental example.

The following is determined from Tables 1 to 5.

First, the samples 1 to 48 listed in Tables 2 and 4 will be first considered. Any one of all the glass G1 to G36 listed in Table 1 was used for the samples 1 to 48. It is to be noted the content of the "glass" was made constant to be "13 weight %" for all of the samples 1 to 48.

Samples 1 and 2 were not sufficiently sintered. This is assumed to be because of the use of the glass G1 with the Li$_2$O content lower than 0.3 weight %.

Samples 6 and 7 decreased in insulation reliability. This is assumed to be because of the use of the glass G5 with the Li$_2$O content higher than 7.5 weight %.

Samples 11 and 12 deteriorated in temperature coefficient of capacitance β. This is assumed to be because of the use of the glass G8 with the alkaline-earth metal content lower than 44.0 weight %.

Sample 18 was not sufficiently sintered. This is assumed to be because of the use of the glass G13 with the alkaline-earth metal content higher than 69.0 weight %.

Sample 20 was not sufficiently sintered. This is assumed to be because of the use of the glass G15 with the B$_2$O$_3$ content lower than 10.0 weight %.

Sample 22 was not sufficiently sintered. This is assumed to be because of the use of the glass G17 with the SiO$_2$ content higher than 30.0 weight %.

Sample 24 decreased in insulation reliability. This is assumed to be because of the use of the glass G19 with the B$_2$O$_3$ content higher than 20.0 weight %.

Samples 39 and 40 deteriorated in temperature coefficient of capacitance β. This is assumed to be because of the use of the glass G32 with the MgO content lower than 0.1 weight %.

Samples 41 and 42 decreased in insulation reliability. This is assumed to be because of the use of the glass G33 with the MgO content higher than 5.5 weight %.

Samples 43 and 44 were not vitrified. This is assumed to be because of the use of the glass G34 with the SiO$_2$ content lower than 14.2 weight %.

Samples 45 and 46 decreased in insulation reliability. This is assumed to be because of the use of the glass G35 with the Al$_2$O$_3$ content lower than 0.5 weight %.

Samples 47 and 48 decreased in insulation reliability. This is assumed to be because of the use of the glass G36 with the Al$_2$O$_3$ content higher than 4.0 weight %.

The samples 3 to 5, 8 to 10, 13 to 17, 19, 21, 23, and 25 to 38 shown in Tables 2 and 4, other than samples 1, 2, 6, 7, 11, 12, 18, 20, 22, 24, and 39 to 48 mentioned above, achieved favorable results of Qf: 5000 GHz or higher, β: 150 ppm/K or lower in terms of absolute value, and insulation reliability: 11 or more in log (IR [Ω]).

This is assumed to be because of the use of any one of the glass G2, G3, G4, G6, G7, G9, G10, G11, G12, G14, G16, G18, G20, G21, G22, G23, G24, G25, G26, G27, G28, G29, G30, and G31 which satisfy the conditions of: the alkaline-earth metal content of 44.0 to 69.0 weight %; the SiO$_2$ content of 14.2 to 30.0 weight %; the B$_2$O$_3$ content of 10.0 to 20.0 weight %; the Al$_2$O$_3$ content of 0.5 to 4.0 weight %; the Li$_2$O content of 0.3 to 7.5 weight %; and the MgO content of 0.1 to 5.5 weight %.

As for ∈$_r$, all of the samples shown in Tables 2 and 4, except for the samples with the evaluation results of "Unsintered" or "Unvitrified", achieved a value of 15 or less.

Next, the samples 49 to 87 shown in Tables 3 and 5 will be considered. For the samples 49 to 87, the respective contents of "Glass", "First Ceramic", "Second Ceramic", "MnO", and "CuO" were varied while the glass G22 shown in Table 1 was used as the "Glass".

Sample 49 deteriorated in temperature coefficient of capacitance β. This is assumed to be because the BaO content was lower than 0.38 weight % in the second ceramic.

Sample 50 was not sufficiently sintered. This is assumed to be because the MnO content was lower than 7.5 weight %.

Sample 54 was not sufficiently sintered. This is assumed to be because the glass content was lower than 6 weight %.

Sample 57 deteriorated in temperature coefficient of capacitance β. This is assumed to be because the content of $Mg_2SiO_4$ as the first ceramic was higher than 69.32 weight %.

Sample 58 deteriorated in temperature coefficient of capacitance β. This is assumed to be because the $TiO_2$ content was lower than 0.95 weight % in the second ceramic.

Sample 69 decreased in insulation reliability. This is assumed to be because the content of $Nd_2O_3$ as $RE_2O_3$ was higher than 9.5 weight % in the second ceramic.

Sample 72 decreased in insulation reliability. This is assumed to be because the BaO content was higher than 1.43 weight % in the second ceramic.

Sample 73 decreased in insulation reliability. This is assumed to be because the glass content was higher than 20 weight %.

Sample 76 decreased in insulation reliability. This is assumed to be because the $TiO_2$ content was higher than 6.75 weight % in the second ceramic.

Sample 77 deteriorated in temperature coefficient of capacitance β. This is assumed to be because the MnO content was higher than 18.5 weight %.

Sample 78 decreased in insulation reliability. This is assumed to be because the CuO content was higher than 0.23 weight %.

Sample 82 deteriorated in temperature coefficient of capacitance β. This is assumed to be because the content of $Nd_2O_3$ as $RE_2O_3$ was lower than 1.33 weight % in the second ceramic.

Sample 83 decreased in Qf. This is assumed to be because the content of $Mg_2SiO_4$ as the first ceramic was lower than 47.55 weight %.

Sample 84 deteriorated in temperature coefficient of capacitance β. This is assumed to be because the content of $MgAl_2O_4$ as the first ceramic was higher than 69.32 weight %.

Sample 85 decreased in Qf. This is assumed to be because the content of $MgAl_2O_4$ as the first ceramic was lower than 47.55 weight %.

Sample 86 decreased in insulation reliability. This is assumed to be because the content of $Sm_2O_3$ as $RE_2O_3$ was higher than 9.5 weight % in the second ceramic.

Sample 87 deteriorated in temperature coefficient of capacitance β. This is assumed to be because the content of $Sm_2O_3$ as $RE_2O_3$ was lower than 1.33 weight % in the second ceramic.

The samples 51 to 53, 55, 56, 59 to 68, 70, 71, 74, 75, and 79 to 81 shown in Tables 3 and 5, other than the samples 49, 50, 54, 57, 58, 69, 72, 73, 76 to 78, and 82 to 87 mentioned above, achieved favorable results of Qf: 5000 GHz or higher, β: 150 ppm/K or less in terms of absolute value, and insulation reliability: 11 or more in log (IR [Ω]).

This is assumed to be because of the satisfied conditions of: first ceramic content of 47.55 to 69.32 weight %; glass content of 6 to 20 weight %; MnO content of 7.5 to 18.5 weight %; BaO content of 0.38 to 1.43 weight %; $RE_2O_3$ content of 1.33 to 9.5 weight %; $TiO_2$ content of 0.95 to 6.75 weight %; and CuO content of 0.23 weight % or less.

As for $\in_r$, all of the samples shown in Tables 3 and 5, except for the samples with the evaluation results of "Unsintered", achieved a value of 15 or less.

It is to be noted that while $Nd_2O_3$ and $Sm_2O_3$ were used as $RE_2O_3$ in the second ceramic in Experimental Example 1, it has been confirmed that similar tendencies are also shown when other rare-earth elements are used.

Experimental Example 2

In Experimental Example 2, low-dielectric-constant dielectric materials were prepared as in Experimental Example 1, and in particular, the influences on the low-dielectric-constant dielectric materials were examined by the addition of the third ceramic including at least one of $Mg_2Al_4Si_8O_{18}$ and $BaAl_2Si_2O_8$.

Respective powders of spinel compound: $MgAl_2O_4$ and forsterite compound: $Mg_2SiO_4$, BaO, $TiO_2$, $Nd_2O_3$ and $Sm_2O_3$ as $RE_2O_3$, MnO, as well as CuO were prepared as in the case of Experimental Example 1.

In addition, in this Experimental Example 2, as the third ceramic, as shown in Table 6, $MgCO_3$, $Al_2O_3$, and $SiO_2$ were blended in predetermined proportions, and subjected to calcination, and wet grinding to prepare a powder of cordierite compound: $Mg_2Al_4Si_5O_{18}$. In addition, as the third ceramic, also as shown in Table 6, $BaCO_3$, $Al_2O_3$, and $SiO_2$ were blended in predetermined proportions, and subjected to calcination, and wet grinding to prepare a powder of celsian compound: $BaAl_2Si_2O_8$.

Furthermore, as shown in Table 7, respective powders of BaO, MgO, $Al_2O_3$, and $SiO_2$ were prepared as oxides for providing elements constituting the above mentioned cordierite compound: $Mg_2Al_4Si_5O_{18}$ and the celsian compound: $BaAl_2Si_2O_8$, because the oxides mentioned above were not enough.

Next, respective powders of the glass shown in Table 1, $MgAl_2O_4$, $Mg_2SiO_4$, BaO, $TiO_2$, $Nd_2O_3$ and $Sm_2O_3$ as $RE_2O_3$, MnO, and CuO were blended for the compositions shown in Tables 6 and 7. Furthermore, respective powders of $Mg_2Al_4Si_5O_{18}$ and $BaAl_2Si_2O_8$ as the third ceramic were blended for the samples listed in Table 6. In addition, respective powders of MgO, $Al_2O_3$, and $SiO_2$ were further blended for the sample 112 listed in Table 7. For the sample 113 listed in Table 7, respective powders of MgO, $Al_2O_3$, and $SiO_2$ were further blended, and the amount of the BaO powder was increased. Then, these powders were mixed, and an organic solvent and a binder were then added to the mixture to prepare slurry.

TABLE 6

| Sample Number | First Ceramic Glass Symbol | Glass (weight %) | Second Ceramic (weight %) | | | | $RE_2O_3$ | | MnO (weight %) | CuO (weight %) | Third Ceramic (weight %) | |
|---|---|---|---|---|---|---|---|---|---|---|---|---|
| | | | $MgAl_2O_4$ | $Mg_2SiO_4$ | BaO | $TiO_2$ | $Nd_2O_3$ | $Sm_2O_3$ | | | $Mg_2Al_4Si_5O_{18}$ | $BaAl_2Si_2O_8$ |
| 101* | G30 | 13 | 0 | 61.92 | 0.8 | 3.8 | 5.4 | 0 | 15 | 0.08 | 0 | 0 |
| 102 | G30 | 13 | 0 | 51.92 | 0.8 | 3.8 | 5.4 | 0 | 15 | 0.08 | 10 | 0 |
| 103* | G11 | 13 | 0 | 52.31 | 1.42 | 6.74 | 4.5 | 5 | 15 | 0.03 | 2 | 0 |
| 104 | G22 | 13 | 62.87 | 0 | 0.6 | 2.5 | 3 | 0 | 15 | 0.03 | 3 | 0 |
| 105 | G28 | 12 | 0 | 47.82 | 0.6 | 2.5 | 3 | 0 | 14 | 0.08 | 20 | 0 |
| 106* | G20 | 11.25 | 0 | 47.57 | 0.6 | 2.5 | 3 | 0 | 14 | 0.08 | 21 | 0 |
| 107* | G14 | 13 | 0 | 58.62 | 1.2 | 4 | 6.1 | 0 | 15 | 0.08 | 0 | 2 |
| 108 | G22 | 13 | 0 | 61.37 | 0.6 | 2.5 | 3 | 0 | 16.5 | 0.03 | 0 | 3 |

TABLE 6-continued

| Sample Number | Glass Symbol | Glass (weight %) | First Ceramic (weight %) | | Second Ceramic (weight %) | | | | MnO (weight %) | CuO (weight %) | Third Ceramic (weight %) | |
|---|---|---|---|---|---|---|---|---|---|---|---|---|
| | | | MgAl$_2$O$_4$ | Mg$_2$SiO$_4$ | BaO | TiO$_2$ | RE$_2$O$_3$ | | | | Mg$_2$Al$_4$Si$_5$O$_{18}$ | BaAl$_2$Si$_2$O$_8$ |
| | | | | | | | Nd$_2$O$_3$ | Sm$_2$O$_3$ | | | | |
| 109 | G22 | 12.5 | 47.85 | 0 | 0.6 | 2.5 | 3 | 0 | 13.5 | 0.05 | 0 | 20 |
| 110* | G27 | 12.5 | 0 | 47.87 | 0.6 | 2.5 | 3 | 0 | 12.5 | 0.03 | 0 | 21 |
| 111 | G22 | 13 | 10 | 41.92 | 0.8 | 3.8 | 5.4 | 0 | 15 | 0.08 | 6 | 4 |

TABLE 7

| Sample Number | Glass Symbol | Glass (weight %) | First Ceramic (weight %) | | Second Ceramic (weight %) | | | |
|---|---|---|---|---|---|---|---|---|
| | | | MgAl$_2$O$_4$ | Mg$_2$SiO$_4$ | BaO | TiO$_2$ | RE$_2$O$_3$ | |
| | | | | | | | Nd$_2$O$_3$ | Sm$_2$O$_3$ |
| 112 | G22 | 12 | 0 | 49.42 | 0.8 | 3.8 | 5.4 | 0 |
| 113 | G30 | 13 | 0 | 53.85 | 4.78 | 3.2 | 4.2 | 0 |

| Sample Number | MnO (weight %) | CuO (weight %) | MgO (weight %) | Al$_2$O$_3$ (weight %) | SiO$_2$ (weight %) |
|---|---|---|---|---|---|
| 112 | 16.39 | 0.08 | 1.67 | 4.22 | 6.22 |
| 113 | 15 | 0.05 | 0 | 2.72 | 3.2 |

Thereafter, in the same manner as in the case of Experimental Example 1, samples were prepared, and evaluated for relative permittivity ($\varepsilon_r$), Qf, temperature coefficient of capacitance ($\beta$), and insulation reliability as shown in Table 8. This experimental example was aimed at obtaining a dielectric material with lower $\varepsilon_r$, such as $\varepsilon_r$ of 8 or less. It is to be noted that, more strictly, the sample with $\beta$ in excess of 100 ppm/K in terms of absolute value was determined as a failure. In the column "Insulation Reliability" of Table 8, for the same test carried out as in the case of Experimental Example 1, the case with log (IR [Ω]) of less than 11 after the test is indicated by "B", whereas the case with log (IR [Ω]) of 11 or more is indicated by "A".

Further, the reasons for the failures are briefly described in the column of "Remarks" of Table 8 for the failed samples in this experimental example.

TABLE 8

| Sample Number | $\varepsilon_r$ | Qf (GHz) | $\beta$ (ppm/K) | Insulation Reliability | Remarks |
|---|---|---|---|---|---|
| 101* | 10 | 6000 | 133 | A | large $\varepsilon$, large $\beta$ |
| 102 | 7 | 6200 | 98 | A | |
| 103* | 12 | 5200 | 125 | A | large $\varepsilon$, large $\beta$ |
| 104 | 8 | 5400 | 98 | A | |
| 105 | 6 | 5100 | 85 | A | |
| 106* | 6 | 4200 | 75 | A | Decreased Qf |
| 107* | 10 | 5200 | 115 | A | large $\varepsilon$, large $\beta$ |
| 108 | 8 | 5200 | 98 | A | |
| 109 | 7 | 5500 | 88 | A | |
| 110* | 7 | 4000 | 75 | A | Decreased Qf |
| 111 | 7 | 5400 | 91 | A | |
| 112 | 7 | 5500 | 88 | A | |
| 113 | 8 | 5400 | 90 | A | |

In Table 8, the sample numbers are marked with * for the samples determined as failures in this experimental example.

The following is determined from Tables 6 to 8.

In comparison between the samples 102, 104 to 106, and 108 to 113 containing 3 weight % or more of the third ceramic including at least one of Mg$_2$Al$_4$Si$_5$O$_{18}$ and BaAl$_2$Si$_2$O$_8$, and the samples 101, 103, and 107 containing none of them, the former achieves lower $\varepsilon_r$, such as 8 or less, and also results in a temperature coefficient of capacitance $\beta$ of 100 ppm/K or lower in terms of absolute value.

In addition, as can be seen from the samples 112 and 113, the composite oxides such as Mg$_2$Al$_4$Si$_5$O$_{18}$ and BaAl$_2$Si$_2$O$_8$ achieve similar effects even with the addition of the single oxides as materials for the composite oxides.

On the other hand, in the case of the samples 106 and 110 containing more than 20 weight % of the third ceramic including at least one of Mg$_2$Al$_4$Si$_5$O$_{18}$ and BaAl$_2$Si$_2$O$_8$, decreases in Qf were observed.

Experimental Example 3

In Experimental Example 3, relatively high-dielectric-constant dielectric materials were prepared.

Respective powders of spinel compound: MgAl$_2$O$_4$ and forsterite compound: Mg$_2$SiO$_4$ as the first ceramic, BaO, TiO$_2$, and Nd$_2$O$_3$ as RE$_2$O$_3$ to serve as the second ceramic, MnO, as well as CuO were prepared as in the case of Experimental Example 1.

Next, for the compositions shown in Tables 9 and 10, respective powders of the glass shown in Table 1, MgAl$_2$O$_4$, Mg$_2$SiO$_4$, BaO, TiO$_2$, Nd$_2$O$_3$, MnO, and CuO were blended and mixed, and an organic solvent and a binder were then added to the mixture to prepare slurry.

TABLE 9

| Sample Number | Glass Symbol | First Ceramic (weight %) | | Second Ceramic (weight %) | | | | |
|---|---|---|---|---|---|---|---|---|
| | | MgAl$_2$O$_4$ (weight %) | Mg$_2$SiO$_4$ | BaO (weight %) | TiO$_2$ (weight %) | Nd$_2$O$_3$ (weight %) | MnO (weight %) | CuO (weight %) |
| 201 | G1 | 9 | 3 | 3 | 5.5 | 28 | 48.1 | 2.8 | 0.6 |
| 202 | G2 | 9 | 3 | 3 | 5.5 | 28 | 48.1 | 2.8 | 0.6 |
| 203 | G3 | 9 | 3 | 3 | 5.5 | 28 | 48.1 | 2.8 | 0.6 |
| 204 | G4 | 9 | 3 | 3 | 5.5 | 28 | 48.1 | 2.8 | 0.6 |
| 205 | G5 | 9 | 3 | 3 | 5.5 | 28 | 48.1 | 2.8 | 0.6 |
| 206 | G6 | 9 | 3 | 3 | 5.5 | 28 | 48.1 | 2.8 | 0.6 |
| 207 | G7 | 9 | 3 | 3 | 5.5 | 28 | 48.1 | 2.8 | 0.6 |
| 208 | G8 | 9 | 3 | 3 | 5.5 | 28 | 48.1 | 2.8 | 0.6 |
| 209 | G9 | 9 | 3 | 3 | 5.5 | 28 | 48.1 | 2.8 | 0.6 |
| 210 | G10 | 9 | 3 | 3 | 5.5 | 28 | 48.1 | 2.8 | 0.6 |
| 211 | G11 | 9 | 3 | 3 | 5.5 | 28 | 48.1 | 2.8 | 0.6 |
| 212 | G12 | 9 | 3 | 3 | 5.5 | 28 | 48.1 | 2.8 | 0.6 |
| 213 | G13 | 9 | 3 | 3 | 5.5 | 28 | 48.1 | 2.8 | 0.6 |
| 214 | G14 | 9 | 3 | 3 | 5.5 | 28 | 48.1 | 2.8 | 0.6 |
| 215 | G15 | 9 | 3 | 3 | 5.5 | 28 | 48.1 | 2.8 | 0.6 |
| 216 | G16 | 9 | 3 | 3 | 5.5 | 28 | 48.1 | 2.8 | 0.6 |
| 217 | G17 | 9 | 3 | 3 | 5.5 | 28 | 48.1 | 2.8 | 0.6 |
| 218 | G18 | 9 | 3 | 3 | 5.5 | 28 | 48.1 | 2.8 | 0.6 |
| 219 | G19 | 9 | 3 | 3 | 5.5 | 28 | 48.1 | 2.8 | 0.6 |
| 220 | G20 | 9 | 3 | 3 | 5.5 | 28 | 48.1 | 2.8 | 0.6 |
| 221 | G21 | 9 | 3 | 3 | 5.5 | 28 | 48.1 | 2.8 | 0.6 |
| 222 | G22 | 9 | 3 | 3 | 5.5 | 28 | 48.1 | 2.8 | 0.6 |
| 223 | G23 | 9 | 3 | 3 | 5.5 | 28 | 48.1 | 2.8 | 0.6 |
| 224 | G24 | 9 | 3 | 3 | 5.5 | 28 | 48.1 | 2.8 | 0.6 |
| 225 | G25 | 9 | 3 | 3 | 5.5 | 28 | 48.1 | 2.8 | 0.6 |
| 226 | G26 | 9 | 3 | 3 | 5.5 | 28 | 48.1 | 2.8 | 0.6 |
| 227 | G27 | 9 | 3 | 3 | 5.5 | 28 | 48.1 | 2.8 | 0.6 |
| 228 | G28 | 9 | 3 | 3 | 5.5 | 28 | 48.1 | 2.8 | 0.6 |
| 229 | G29 | 9 | 3 | 3 | 5.5 | 28 | 48.1 | 2.8 | 0.6 |
| 230 | G30 | 9 | 3 | 3 | 5.5 | 28 | 48.1 | 2.8 | 0.6 |
| 231 | G31 | 9 | 3 | 3 | 5.5 | 28 | 48.1 | 2.8 | 0.6 |
| 232 | G32 | 9 | 3 | 3 | 5.5 | 28 | 48.1 | 2.8 | 0.6 |
| 233 | G33 | 9 | 3 | 3 | 5.5 | 28 | 48.1 | 2.8 | 0.6 |
| 234 | G34 | 9 | 3 | 3 | 5.5 | 28 | 48.1 | 2.8 | 0.6 |
| 235 | G35 | 9 | 3 | 3 | 5.5 | 28 | 48.1 | 2.8 | 0.6 |
| 236 | G36 | 9 | 3 | 3 | 5.5 | 28 | 48.1 | 2.8 | 0.6 |

TABLE 10

| Sample Number | Glass Symbol | First Ceramic (weight %) | | Second Ceramic (weight %) | | | | |
|---|---|---|---|---|---|---|---|---|
| | | MgAl$_2$O$_4$ (weight %) | Mg$_2$SiO$_4$ | BaO (weight %) | TiO$_2$ (weight %) | Nd$_2$O$_3$ (weight %) | MnO (weight %) | CuO (weight %) |
| 237 | G22 | 5 | 5 | 1 | 18.3 | 28 | 38.5 | 3.8 | 0.4 |
| 238 | G22 | 5 | 5 | 1 | 1.5 | 32.5 | 50.8 | 3.8 | 0.4 |
| 239 | G22 | 5 | 5 | 1 | 2.5 | 26.4 | 55.9 | 3.8 | 0.4 |
| 240 | G22 | 5 | 5 | 1 | 12.8 | 10.5 | 61.5 | 3.8 | 0.4 |
| 241 | G22 | 5 | 5 | 1 | 15.7 | 11.2 | 57.9 | 3.8 | 0.4 |
| 242 | G22 | 5 | 5 | 1 | 12.7 | 36.4 | 35.7 | 3.8 | 0.4 |
| 243 | G22 | 5 | 5 | 1 | 13.2 | 38.3 | 33.3 | 3.8 | 0.4 |
| 244 | G22 | 5 | 5 | 1 | 6.1 | 13.4 | 65.3 | 3.8 | 0.4 |
| 245 | G22 | 3 | 1 | 0 | 4.4 | 20.5 | 68.1 | 2.4 | 0.6 |
| 246 | G22 | 3.5 | 0 | 1 | 3.5 | 30 | 59 | 2.4 | 0.6 |
| 247 | G22 | 11 | 7 | 8 | 4.3 | 22.7 | 38 | 8 | 1 |
| 248 | G22 | 14 | 0 | 15 | 8.9 | 26.5 | 24.6 | 10 | 1 |
| 249 | G22 | 15 | 0 | 15 | 6.5 | 30.5 | 22 | 10 | 1 |
| 250 | G22 | 2 | 3 | 3 | 10.7 | 28.2 | 49.7 | 2.8 | 0.6 |
| 251 | G22 | 3 | 3 | 3 | 10.7 | 28.2 | 48.7 | 2.8 | 0.6 |
| 252 | G22 | 8 | 3 | 3 | 10.7 | 28.2 | 43.7 | 2.8 | 0.6 |
| 253 | G22 | 12 | 3 | 3 | 10.7 | 28.2 | 39.7 | 2.8 | 0.6 |
| 254 | G21 | 15 | 3 | 3 | 10.7 | 28.2 | 36.7 | 2.8 | 0.6 |
| 255 | G22 | 17 | 3 | 3 | 10.7 | 28.2 | 34.7 | 2.8 | 0.6 |
| 256 | G22 | 5 | 17 | 0 | 10.7 | 28.2 | 35.7 | 2.8 | 0.6 |
| 257 | G22 | 5 | 15 | 0 | 10.7 | 28.2 | 37.7 | 2.8 | 0.6 |
| 258 | G22 | 5 | 10 | 0 | 10.7 | 28.2 | 42.7 | 2.8 | 0.6 |
| 259 | G22 | 5 | 0.5 | 0 | 10.7 | 28.2 | 52.2 | 2.8 | 0.6 |

TABLE 10-continued

| Sample Number | Glass Symbol | First Ceramic (weight %) | | Second Ceramic (weight %) | | | | |
|---|---|---|---|---|---|---|---|---|
| | | (weight %) | MgAl$_2$O$_4$ | Mg$_2$SiO$_4$ | BaO (weight %) | TiO$_2$ (weight %) | Nd$_2$O$_3$ (weight %) | MnO (weight %) | CuO (weight %) |
| 260 | G22 | 5 | 0 | 17  | 10.7 | 28.2 | 35.7 | 2.8 | 0.6 |
| 261 | G22 | 5 | 0 | 15  | 10.7 | 28.2 | 37.7 | 2.8 | 0.6 |
| 262 | G22 | 5 | 0 | 10  | 10.7 | 28.2 | 42.7 | 2.8 | 0.6 |
| 263 | G22 | 5 | 0 | 0.5 | 10.7 | 28.2 | 52.2 | 2.8 | 0.6 |
| 264 | G22 | 5 | 3 | 3   | 10.7 | 28.2 | 48.5 | 1   | 0.6 |
| 265 | G22 | 5 | 3 | 3   | 10.7 | 28.2 | 47.8 | 2.3 | 0   |
| 266 | G22 | 5 | 3 | 3   | 10.7 | 28.2 | 37.5 | 12  | 0.6 |
| 267 | G21 | 5 | 3 | 3   | 10.7 | 28.2 | 47.3 | 2.8 | 0   |
| 268 | G22 | 5 | 3 | 3   | 10.7 | 28.2 | 47.1 | 2.8 | 0.2 |
| 269 | G22 | 5 | 3 | 3   | 10.7 | 28.2 | 46.1 | 2.8 | 1.2 |
| 270 | G22 | 5 | 3 | 3   | 10.7 | 28.2 | 45.8 | 2.8 | 1.5 |

Thereafter, in the same manner as in the case of Experimental Example 1, samples were prepared, and evaluated for relative permittivity ($\epsilon_r$), Qf, temperature coefficient of capacitance ($\beta$), and insulation reliability as shown in Tables 11 and 12. This experimental example was aimed at obtaining a dielectric material with $\epsilon_r$ of 30 or more. The sample with Qf less than 5000 GHz was determined as a failure, whereas the sample with $\beta$ in excess of 150 ppm/K in terms of absolute value was determined as a failure. In addition, in the columns "Insulation Reliability" of Tables 11 and 12, for the same test carried out as in the case of Experimental Example 1, the case with log (IR [$\Omega$]) of less than 11 after the test is indicated by "B", whereas the case with log (IR [$\Omega$]) of 11 or more is indicated by "A".

It is to be noted that the insufficiently sintered sample is shown as "Unsintered" in the column of "Remarks" in Tables 11 and 12, whereas the sample with the glass unvitrified is shown as "Unvitrified" in the column of "Remarks", and these samples were not evaluated for each of $\epsilon_r$, Qf, $\beta$, and insulation reliability. In addition, the reasons for the failures are briefly described in the column of "Remarks" for the failed samples in this experimental example.

TABLE 11

| Sample Number | $\epsilon_r$ | Qf (GHz) | $\beta$ (ppm/K) | Insulation Reliability | Remarks |
|---|---|---|---|---|---|
| 201* | — | — | — | — | Unsintered |
| 202 | 43 | 6600 | −58 | A | |
| 203 | 45 | 6400 | −30 | A | |
| 204 | 35 | 5800 | −22 | A | |
| 205* | 51 | 5500 | −59 | B | Decreased Insulation Reliability |
| 206 | 38 | 6600 | −15 | A | |
| 207 | 38 | 6800 | 24 | A | |
| 208* | 28 | 6100 | 55 | B | low $\epsilon$, Decreased Insulation Reliability |
| 209 | 34 | 6300 | 20 | A | |
| 210 | 32 | 6500 | 44 | A | |
| 211 | 43 | 6600 | 47 | A | |
| 212 | 40 | 6600 | −24 | A | |
| 213* | — | — | — | — | Unsintered |
| 214 | 42 | 6300 | −12 | A | |
| 215* | — | — | — | — | Unsintered |
| 216 | 44 | 6000 | 38 | A | |
| 217* | — | — | — | — | Unsintered |
| 218 | 39 | 6200 | 38 | A | |
| 219* | 44 | 6200 | 38 | B | Decreased Insulation Reliability |
| 220 | 41 | 6000 | −5 | A | |
| 221 | 35 | 9600 | −55 | A | |

TABLE 11-continued

| Sample Number | $\epsilon_r$ | Qf (GHz) | $\beta$ (ppm/K) | Insulation Reliability | Remarks |
|---|---|---|---|---|---|
| 222 | 41 | 9800 | 25 | A | |
| 223 | 43 | 2000 | −59 | A | |
| 224 | 38 | 6400 | −39 | A | |
| 225 | 43 | 6700 | −55 | A | |
| 226 | 42 | 7200 | 38 | A | |
| 227 | 41 | 7000 | −45 | A | |
| 228 | 44 | 7400 | 49 | A | |
| 229 | 41 | 6500 | −25 | A | |
| 230 | 38 | 7500 | 38 | A | |
| 231 | 41 | 7400 | −29 | A | |
| 232* | 46 | 2300 | −22 | A | Decreased Qf |
| 233* | 45 | 5600 | 59 | B | Decreased Insulation Reliability |
| 234* | — | — | — | — | Unvitrified |
| 235* | 46 | 5700 | 58 | B | Decreased Insulation Reliability |
| 236* | 48 | 5200 | 58 | B | Decreased Insulation Reliability |

TABLE 12

| Sample Number | $\epsilon_r$ | Qf (GHz) | $\beta$ (ppm/K) | Insulation Reliability | Remarks |
|---|---|---|---|---|---|
| 237* | 47 | 6200 | −25 | B | Decreased Insulation Reliability |
| 238* | 16 | 6600 | −58 | A | low $\epsilon$ |
| 239 | 32 | 6400 | −30 | A | |
| 240* | 35 | 5800 | −22 | B | Decreased Insulation Reliability |
| 241 | 51 | 6500 | −67 | A | |
| 242 | 48 | 6200 | −72 | A | |
| 243* | 15 | 5800 | 24 | A | low $\epsilon$ |
| 244 | 36 | 5100 | 35 | A | |
| 245* | — | — | — | — | Unsintered |
| 246 | 36 | 6100 | −28 | A | |
| 247 | 41 | 6200 | 44 | A | |
| 248 | 44 | 6300 | 38 | A | |
| 249* | 25 | 6000 | −5 | B | $\epsilon$ low |
| 250* | 34 | — | — | — | Unsintered |
| 251 | 32 | 5500 | 44 | A | |
| 252 | 40 | 6600 | −24 | A | |
| 253 | 42 | 5800 | −27 | A | |
| 254 | — | — | — | A | |
| 255* | 42 | 6800 | 54 | B | Decreased Insulation Reliability |
| 256* | 35 | 5100 | 180 | A | Deteriorated $\beta$ |
| 257 | 39 | 5000 | 35 | A | |
| 258 | 43 | 5000 | −59 | A | |
| 259* | 33 | 5100 | −195 | A | Deteriorated $\beta$ |
| 260* | 33 | 6100 | 155 | A | Deteriorated $\beta$ |

TABLE 12-continued

| Sample Number | εr | Qf (GHz) | β (ppm/K) | Insulation Reliability | Remarks |
|---|---|---|---|---|---|
| 261 | 32 | 6100 | −28 | A | |
| 262 | 39 | 5900 | −24 | A | |
| 263* | 37 | 6500 | −180 | A | Deteriorated β |
| 264* | — | 5600 | 45 | B | Decreased Insulation Reliability |
| 265 | 45 | 6400 | 31 | A | |
| 266* | 34 | 1800 | 12 | A | Decreased Qf |
| 267 | 42 | 6300 | 27 | A | |
| 268 | 47 | 6200 | 42 | A | |
| 269 | 36 | 6700 | 37 | A | |
| 270* | 41 | 6300 | −30 | B | Decreased Insulation Reliability |

In Tables 11 and 12, the sample numbers are marked with * for the samples determined as failures in this experimental example.

The following is determined from Tables 9 to 12.

First, the samples 201 to 236 shown in Tables 9 and 11 will be considered. Any one of all the glass G1 to G36 listed in Table 1 was used for the samples 201 to 236. It is to be noted the content of the "glass" was made constant to be "9 weight %" for all of the samples 201 to 236.

Sample 201 was not sufficiently sintered. This is assumed to be because of the use of the glass G1 with the $Li_2O$ content lower than 0.3 weight %.

Sample 205 decreased in insulation reliability. This is assumed to be because of the use of the glass G5 with the $Li_2O$ content higher than 7.5 weight %.

Sample 208 with low $\epsilon_r$ decreased in insulation reliability. This is assumed to be because of the use of the glass G8 with the alkaline-earth metal content lower than 44.0 weight %.

Sample 213 was not sufficiently sintered. This is assumed to be because of the use of the glass G13 with the alkaline-earth metal content higher than 69.0 weight %.

Sample 215 was not sufficiently sintered. This is assumed to be because of the use of the glass G15 with the $B_2O_3$ content lower than 10.0 weight %.

Sample 217 was not sufficiently sintered. This is assumed to be because of the use of the glass G17 with the $SiO_2$ content higher than 30.0 weight %.

Sample 219 decreased in insulation reliability. This is assumed to be because of the use of the glass G19 with the $B_2O_3$ content higher than 20.0 weight %.

Sample 232 decreased in Qf. This is assumed to be because of the use of the glass G32 with the MgO content lower than 0.1 weight %.

Sample 233 decreased in insulation reliability. This is assumed to be because of the use of the glass G33 with the MgO content higher than 5.5 weight %.

Sample 234 was not vitrified. This is assumed to be because of the use of the glass G34 with the $SiO_2$ content lower than 14.2 weight %.

Sample 235 decreased in insulation reliability. This is assumed to be because of the use of the glass G35 with the $Al_2O_3$ content lower than 0.5 weight %.

Sample 236 decreased in insulation reliability. This is assumed to be because of the use of the glass G36 with the $Al_2O_3$ content higher than 4.0 weight %.

The samples 202 to 204, 206, 207, 209 to 212, 214, 216, 218, and 220 to 231 listed in Tables 9 and 11, except for the samples 201, 205, 208, 213, 215, 217, 219, and 232 to 236, exhibited $\epsilon_r$ of 30 or more, and achieved favorable results of Qf: 5000 GHz or higher, β: 150 ppm/K or lower in terms of absolute value, and insulation reliability: 11 or more in log (IR [Ω]).

This is assumed to be because of the use of any one of the glass G2, G3, G4, G6, G7, G9, G10, G11, G12, G14, G16, G18, G20, G21, G22, G23, G24, G25, G26, G27, G28, G29, G30, and G31 which satisfy the conditions of: the alkaline-earth metal content of 44.0 to 69.0 weight %; the $SiO_2$ content of 14.2 to 30.0 weight %; the $B_2O_3$ content of 10.0 to 20.0 weight %; the $Al_2O_3$ content of 0.5 to 4.0 weight %; the $Li_2O$ content of 0.3 to 7.5 weight %; and the MgO content of 0.1 to 5.5 weight %.

Next, the samples 237 to 270 shown in Tables 10 and 12 will be considered. For the samples 237 to 270, the respective contents of "Glass", "First Ceramic", "Second Ceramic", "MnO", and "CuO" were varied while the glass G22 shown in Table 1 was used as the "Glass".

Sample 237 decreased in insulation reliability. This is assumed to be because the BaO content was higher than 15.7 weight % in the second ceramic.

Sample 238 resulted in $\epsilon_r$ less than 30. This is assumed to be because the BaO content was lower than 2.5 weight % in the second ceramic.

Sample 240 decreased in insulation reliability. This is assumed to be because the $TiO_2$ content was lower than 11.2 weight % in the second ceramic.

Sample 243 resulted in $\epsilon_r$ less than 30. This is assumed to be because the $TiO_2$ content was higher than 36.4 weight % in the second ceramic.

Sample 245 was not sufficiently sintered. This is assumed to be because the content of $Nd_2O_3$ as $RE_2O_3$ was higher than 65.3 weight % in the second ceramic.

Sample 249 resulted in $\epsilon_r$ less than 30. This is assumed to be because the content of $Nd_2O_3$ as $RE_2O_3$ was lower than 24.6 weight % in the second ceramic.

Sample 250 was not sufficiently sintered. This is assumed to be because the glass content was lower than 3 weight %.

Sample 255 decreased in insulation reliability. This is assumed to be because the glass content was higher than 15 weight %.

Samples 256 and 260 deteriorated in temperature coefficient of capacitance β. This is assumed to be because the content of $MgAl_2O_4$ or $Mg_2SiO_4$ as the first ceramic was higher than 15 weight %.

Samples 259 and 263 deteriorated in temperature coefficient of capacitance β. This is assumed to be because the content of $MgAl_2O_4$ or $Mg_2SiO_4$ as the first ceramic was lower than 1 weight %.

Sample 264 decreased in insulation reliability. This is assumed to be because the MnO content was lower than 2.3 weight %.

Sample 266 decreased in Qf. This is assumed to be because the MnO content was higher than 10 weight %.

Sample 270 decreased in insulation reliability. This is assumed to be because the CuO content was higher than 1.2 weight %.

The samples 239, 241, 242, 244, 246 to 248, 251 to 254, 257, 258, 261, 262, 265, and 267 to 269 listed in Tables 10 and 12, except for the samples 237, 238, 240, 243, 245, 249, 250, 255, 256, 259, 260, 263, 264, 266, and 270 mentioned above, achieved favorable results of Qf: 5000 GHz or higher, β: 150 ppm/K or lower in terms of absolute value, and insulation reliability: 11 or more in log (IR [Ω]).

This is assumed to be because of the satisfied conditions of: first ceramic content of 1 to 15 weight %; glass content of 3 to 15 weight %; MnO content of 2.3 to 10 weight %; BaO content of 2.5 to 15.7 weight %; $RE_2O_3$ content of 24.6 to 65.3 weight %; $TiO_2$ content of 11.2 to 36.4 weight %; and CuO content of 1.2 weight % or less.

It is to be noted that while $Nd_2O_3$ was used as $RE_2O_3$ in the second ceramic in Experimental Example 3, it has been confirmed that similar tendencies are also shown when other rare-earth elements including $Sm_2O_3$ are used.

Experimental Example 4

In Experimental Example 4, prepared were dielectric materials with intermediate dielectric constants between the low-dielectric-constant dielectric materials prepared in Experimental Examples 1 and 2 and the high-dielectric-constant dielectric materials prepared in Experimental Example 3.

Respective powders of spinel compound: $MgAl_2O_4$ and forsterite compound: $Mg_2SiO_4$ as the first ceramic, BaO, $TiO_2$, and $Nd_2O_3$ and $Sm_2O_3$ as $RE_2O_3$ to serve as the second ceramic, MnO, as well as CuO were prepared as in the case of Experimental Example 1. Furthermore, as in the case of Experimental Example 2, a powder of a cordierite compound: $Mg_2Al_4Si_8O_{18}$ and a powder of a celsian compound: $BaAl_2Si_2O_8$ were prepared as the third ceramic.

Next, for the compositions shown in Tables 13 through 15, respective powders of the glass shown in Table 1, $MgAl_2O_4$, $Mg_2SiO_4$, BaO, $TiO_2$, $Nd_2O_3$ and $Sm_2O_3$ as $RE_2O_3$, MnO, CuO, $Mg_2Al_4Si_8O_{88}$, and $BaAl_2Si_2O_8$ were blended and mixed, and an organic solvent and a binder were then added to the mixture to prepare slurry.

TABLE 13

| Sample Number | Glass Symbol | Glass (weight %) | First Ceramic (weight %) | | Second Ceramic (weight %) | | | | |
|---|---|---|---|---|---|---|---|---|---|
| | | | $MgAl_2O_4$ | $Mg_2SiO_4$ | BaO (weight %) | $TiO_2$ (weight %) | $Nd_2O_3$ (weight %) | MnO (weight %) | CuO (weight %) |
| 301 | G1 | 11.1 | 0 | 28.75 | 3.95 | 18.75 | 26.6 | 10.75 | 0.1 |
| 302 | G1 | 11.5 | 27.5 | 0 | 4.05 | 19.15 | 26.85 | 10.85 | 0.1 |
| 303 | G2 | 11.1 | 0 | 28.75 | 3.95 | 18.75 | 26.6 | 10.75 | 0.1 |
| 304 | G3 | 11.1 | 0 | 28.75 | 3.95 | 18.75 | 26.6 | 10.75 | 0.1 |
| 305 | G4 | 11.1 | 0 | 28.75 | 3.95 | 18.75 | 26.6 | 10.75 | 0.1 |
| 306 | G5 | 11.1 | 0 | 28.75 | 3.95 | 18.75 | 26.6 | 10.75 | 0.1 |
| 307 | G5 | 11.5 | 27.5 | 0 | 4.05 | 19.15 | 26.85 | 10.85 | 0.1 |
| 308 | G6 | 11.1 | 0 | 28.75 | 3.95 | 18.75 | 26.6 | 10.75 | 0.1 |
| 309 | G6 | 11.5 | 27.5 | 0 | 4.05 | 19.15 | 26.85 | 10.85 | 0.1 |
| 310 | G7 | 11.1 | 0 | 28.75 | 3.95 | 18.75 | 26.6 | 10.75 | 0.1 |
| 311 | G8 | 11.1 | 0 | 28.75 | 3.95 | 18.75 | 26.6 | 10.75 | 0.1 |
| 312 | G8 | 11.5 | 27.5 | 0 | 4.05 | 19.15 | 26.85 | 10.85 | 0.1 |
| 313 | G9 | 11.1 | 0 | 28.75 | 3.95 | 18.75 | 26.6 | 10.75 | 0.1 |
| 314 | G9 | 11.5 | 27.5 | 0 | 4.05 | 19.15 | 26.85 | 10.85 | 0.1 |
| 315 | G10 | 11.1 | 0 | 28.75 | 3.95 | 18.75 | 26.6 | 10.75 | 0.1 |
| 316 | G11 | 11.1 | 0 | 28.75 | 3.95 | 18.75 | 26.6 | 10.75 | 0.1 |
| 317 | G12 | 11.1 | 0 | 28.75 | 3.95 | 18.75 | 26.6 | 10.75 | 0.1 |
| 318 | G13 | 11.1 | 0 | 28.75 | 3.95 | 18.75 | 26.6 | 10.75 | 0.1 |
| 319 | G14 | 11.1 | 0 | 28.75 | 3.95 | 18.75 | 26.6 | 10.75 | 0.1 |
| 320 | G15 | 11.1 | 0 | 28.75 | 3.95 | 18.75 | 26.6 | 10.75 | 0.1 |
| 321 | G16 | 11.1 | 0 | 28.75 | 3.95 | 18.75 | 26.6 | 10.75 | 0.1 |
| 322 | G17 | 11.1 | 0 | 28.75 | 3.95 | 18.75 | 26.6 | 10.75 | 0.1 |
| 323 | G18 | 11.1 | 0 | 28.75 | 3.95 | 18.75 | 26.6 | 10.75 | 0.1 |
| 324 | G19 | 11.1 | 0 | 28.75 | 3.95 | 18.75 | 26.6 | 10.75 | 0.1 |
| 325 | G20 | 11.1 | 0 | 28.75 | 3.95 | 18.75 | 26.6 | 10.75 | 0.1 |
| 326 | G21 | 11.1 | 0 | 28.75 | 3.95 | 18.75 | 26.6 | 10.75 | 0.1 |
| 327 | G22 | 11.1 | 0 | 28.75 | 3.95 | 18.75 | 26.6 | 10.75 | 0.1 |
| 328 | G22 | 11.5 | 27.5 | 0 | 4.05 | 19.15 | 26.85 | 10.85 | 0.1 |
| 329 | G23 | 11.1 | 0 | 28.75 | 3.95 | 18.75 | 26.6 | 10.75 | 0.1 |
| 330 | G23 | 11.5 | 27.5 | 0 | 4.05 | 19.15 | 26.85 | 10.85 | 0.1 |
| 331 | G24 | 11.1 | 0 | 28.75 | 3.95 | 18.75 | 26.6 | 10.75 | 0.1 |
| 332 | G25 | 11.1 | 0 | 28.75 | 3.95 | 18.75 | 26.6 | 10.75 | 0.1 |
| 333 | G26 | 11.1 | 0 | 28.75 | 3.95 | 18.75 | 26.6 | 10.75 | 0.1 |
| 334 | G27 | 11.1 | 0 | 28.75 | 3.95 | 18.75 | 26.6 | 10.75 | 0.1 |
| 335 | G28 | 11.1 | 0 | 28.75 | 3.95 | 18.75 | 26.6 | 10.75 | 0.1 |
| 336 | G29 | 11.1 | 0 | 28.75 | 3.95 | 18.75 | 26.6 | 10.75 | 0.1 |
| 337 | G30 | 11.1 | 0 | 28.75 | 3.95 | 18.75 | 26.6 | 10.75 | 0.1 |
| 338 | G31 | 11.1 | 0 | 28.75 | 3.95 | 18.75 | 26.6 | 10.75 | 0.1 |
| 339 | G32 | 11.1 | 0 | 28.75 | 3.95 | 18.75 | 26.6 | 10.75 | 0.1 |
| 340 | G32 | 11.5 | 27.5 | 0 | 4.05 | 19.15 | 26.85 | 10.85 | 0.1 |
| 341 | G33 | 11.1 | 0 | 28.75 | 3.95 | 18.75 | 26.6 | 10.75 | 0.1 |
| 342 | G33 | 11.5 | 27.5 | 0 | 4.05 | 19.15 | 26.85 | 10.85 | 0.1 |
| 343 | G34 | 11.1 | 0 | 28.75 | 3.95 | 18.75 | 26.6 | 10.75 | 0.1 |
| 344 | G34 | 11.5 | 27.5 | 0 | 4.05 | 19.15 | 26.85 | 10.85 | 0.1 |
| 345 | G35 | 11.1 | 0 | 28.75 | 3.95 | 18.75 | 26.6 | 10.75 | 0.1 |
| 346 | G35 | 11.5 | 27.5 | 0 | 4.05 | 19.15 | 26.85 | 10.85 | 0.1 |
| 347 | G36 | 11.1 | 0 | 28.75 | 3.95 | 18.75 | 26.6 | 10.75 | 0.1 |
| 348 | G36 | 11.5 | 27.5 | 0 | 4.05 | 19.15 | 26.85 | 10.85 | 0.1 |

TABLE 14

| Sample Number | Glass Symbol | First Ceramic (weight %) | Second Ceramic (weight %) | | | | | MnO (weight %) | CuO (weight %) | Third Ceramic (weight %) | |
|---|---|---|---|---|---|---|---|---|---|---|---|
| | | (weight %) | MgAl$_2$O$_4$ | Mg$_2$SiO$_4$ | BaO | TiO$_2$ | RE$_2$O$_3$ Nd$_2$O$_3$ | Sm$_2$O$_3$ | | | Mg$_2$Al$_4$Si$_5$O$_{18}$ | BaAl$_2$Si$_2$O$_8$ |
| 349 | G22 | 6.5 | 0 | 24.25 | 4.25 | 20.6 | 29.95 | 0 | 14.35 | 0.1 | 0 | 0 |
| 350 | G22 | 7 | 0 | 25.25 | 4.2 | 20.55 | 29.65 | 0 | 13.25 | 0.1 | 0 | 0 |
| 351 | G22 | 20 | 0 | 21.65 | 4 | 18.5 | 26.25 | 0 | 9.5 | 0.1 | 0 | 0 |
| 352 | G22 | 21 | 0 | 20.65 | 4 | 18.5 | 26.25 | 0 | 9.5 | 0.1 | 0 | 0 |
| 353 | G22 | 10.75 | 0 | 14 | 4.1 | 19.15 | 28 | 0 | 16.5 | 0.5 | 7 | 0 |
| 354 | G22 | 10.25 | 0 | 15.5 | 4.1 | 19.15 | 28 | 0 | 16.5 | 0.5 | 6 | 0 |
| 355 | G22 | 15.75 | 0 | 47 | 2.25 | 9.5 | 13.2 | 0 | 11.8 | 0.5 | 0 | 0 |
| 356 | G22 | 16 | 0 | 48 | 2.25 | 9.5 | 13.2 | 0 | 10.55 | 0.5 | 0 | 0 |
| 357 | G22 | 10.6 | 15.5 | 0 | 4.1 | 19.15 | 28 | 0 | 15.55 | 0.1 | 7 | 0 |
| 358 | G22 | 15.05 | 47 | 0 | 2.25 | 9.5 | 13.2 | 0 | 12.5 | 0.5 | 0 | 0 |
| 359 | G22 | 12 | 0 | 30.6 | 3.55 | 15.85 | 23.5 | 0 | 14 | 0.5 | 0 | 0 |
| 360 | G22 | 8.5 | 0 | 33.55 | 3.75 | 16.55 | 24.05 | 0 | 13.5 | 0.1 | 0 | 0 |
| 361 | G22 | 11.35 | 0 | 33.25 | 3.95 | 18.25 | 25.7 | 0 | 7 | 0.5 | 0 | 0 |
| 362 | G22 | 8 | 0 | 34.05 | 3.75 | 16.55 | 24.05 | 0 | 13.5 | 0.1 | 0 | 0 |
| 363 | G22 | 14.25 | 0 | 46 | 2 | 9.65 | 13.45 | 0 | 14.55 | 0.1 | 0 | 0 |
| 364 | G22 | 13.5 | 0 | 44.75 | 2.1 | 9.75 | 13.5 | 0 | 16.3 | 0.1 | 0 | 0 |
| 365 | G22 | 12.5 | 36.9 | 0 | 2.35 | 10.5 | 24.25 | 0 | 13.5 | 0 | 0 | 0 |
| 366 | G22 | 11.25 | 0 | 30.8 | 3.75 | 16.55 | 24.05 | 0 | 13.5 | 0.1 | 0 | 0 |
| 367 | G22 | 10.4 | 0 | 15.75 | 5.5 | 24.65 | 34.25 | 0 | 9.35 | 0.1 | 0 | 0 |
| 368 | G22 | 12.75 | 0 | 46.5 | 2.25 | 9 | 13.25 | 0 | 16.15 | 0.1 | 0 | 0 |
| 369 | G22 | 12.95 | 0 | 45.7 | 2.25 | 9.5 | 13.3 | 0 | 15.8 | 0.5 | 0 | 0 |
| 370 | G22 | 10.5 | 28.8 | 0 | 4.15 | 19.25 | 27.2 | 0 | 10 | 0.1 | 0 | 0 |

TABLE 15

| Sample Number | Glass Symbol | First Ceramic (weight %) | Second Ceramic (weight %) | | | | | MnO (weight %) | CuO (weight %) | Third Ceramic (weight %) | |
|---|---|---|---|---|---|---|---|---|---|---|---|
| | | (weight %) | MgAl$_2$O$_4$ | Mg$_2$SiO$_4$ | BaO | TiO$_2$ | RE$_2$O$_3$ Nd$_2$O$_3$ | Sm$_2$O$_3$ | | | Mg$_2$Al$_4$Si$_5$O$_{18}$ | BaAl$_2$Si$_2$O$_8$ |
| 371 | G22 | 11.85 | 0 | 15.55 | 4.75 | 24.75 | 33.5 | 0 | 9.5 | 0.1 | 0 | 0 |
| 372 | G22 | 13 | 0 | 27.5 | 3.9 | 17.5 | 25.5 | 0 | 12.5 | 0.1 | 0 | 0 |
| 373 | G22 | 17.25 | 0 | 38 | 2.45 | 11.85 | 16.35 | 0 | 11.3 | 0.3 | 2.5 | 0 |
| 374 | G22 | 10.25 | 0 | 16.05 | 4.95 | 25.5 | 34.65 | 0 | 8.5 | 0.1 | 0 | 0 |
| 375 | G22 | 15 | 0 | 46.4 | 2.25 | 9.7 | 13.05 | 0 | 13.5 | 0.1 | 0 | 0 |
| 376 | G22 | 14.3 | 0 | 45.25 | 2.55 | 10.35 | 13.2 | 0 | 14.25 | 0.1 | 0 | 0 |
| 377 | G22 | 10.5 | 0 | 29.65 | 4.05 | 18.95 | 26.75 | 0 | 10 | 0.1 | 0 | 0 |
| 378 | G22 | 14.25 | 0 | 45.5 | 2.45 | 10.25 | 0 | 13.2 | 14.25 | 0.1 | 0 | 0 |
| 379 | G22 | 11.5 | 0 | 16.25 | 5 | 24.35 | 0 | 34.75 | 8.05 | 0.1 | 0 | 0 |
| 380 | G22 | 10.5 | 0 | 29.65 | 4.05 | 18.95 | 0 | 26.75 | 10 | 0.1 | 0 | 0 |
| 381 | G22 | 10 | 0 | 15.75 | 5.05 | 24.35 | 35.5 | 0 | 9.25 | 0.1 | 0 | 0 |
| 382 | G22 | 18.9 | 0 | 33.55 | 3.55 | 15.75 | 23.25 | 0 | 4.5 | 0.5 | 0 | 0 |
| 383 | G22 | 17.9 | 0 | 33.55 | 3.55 | 15.75 | 23.25 | 0 | 5.5 | 0.5 | 0 | 0 |
| 384 | G22 | 9.25 | 0 | 25.2 | 3.7 | 16.65 | 24.2 | 0 | 20.5 | 0.5 | 0 | 0 |
| 385 | G22 | 9.25 | 0 | 24.7 | 3.7 | 16.65 | 24.2 | 0 | 21 | 0.5 | 0 | 0 |
| 386 | G22 | 10 | 0 | 15.75 | 5.05 | 24.35 | 34.75 | 0 | 10 | 0.1 | 0 | 0 |
| 387 | G22 | 12 | 0 | 17.25 | 4.75 | 22.25 | 30.85 | 0 | 10.9 | 0.5 | 1.5 | 0 |
| 388 | G22 | 10.5 | 0 | 33.1 | 2.4 | 10.4 | 24.5 | 0 | 11.5 | 0.1 | 7.5 | 0 |
| 389 | G22 | 10.5 | 0 | 35.5 | 2.35 | 9.95 | 22.55 | 0 | 11.55 | 0.1 | 0 | 7.5 |
| 390 | G22 | 10.85 | 0 | 15.75 | 5.2 | 24.5 | 34.25 | 0 | 9.35 | 0.1 | 0 | 0 |
| 391 | G22 | 10.5 | 28.8 | 0 | 4.15 | 19.25 | 0 | 27.2 | 10 | 0.1 | 0 | 0 |
| 392 | G22 | 11.5 | 0 | 32 | 2.4 | 10.45 | 24 | 0 | 11.55 | 0.1 | 8 | 0 |
| 393 | G22 | 10.75 | 0 | 27.55 | 3.85 | 18.25 | 25.55 | 0 | 12.85 | 1.2 | 0 | 0 |
| 394 | G22 | 10.75 | 0 | 30 | 4.35 | 20.25 | 27.65 | 0 | 6.5 | 0.5 | 0 | 0 |
| 395 | G22 | 10.8 | 0 | 27.75 | 3.95 | 17.85 | 25.85 | 0 | 12.4 | 1.4 | 0 | 0 |

Thereafter, in the same manner as in the case of Experimental Example 1, samples were prepared, and evaluated for relative permittivity ($\in_r$), Qf, temperature coefficient of capacitance (β), and insulation reliability as shown in Tables 16 and 17. This experimental example was aimed at obtaining a dielectric material with intermediate $\in_r$, such as with $\in_r$ in the range of 20 to 25. It is to be noted that, most strictly, the sample with β in excess of 60 ppm/K in terms of absolute value was determined as a failure. In the columns "Insulation Reliability" of Tables 16 and 17, for the same test carried out as in the case of Experimental Example 1, the case with log (IR [Ω]) of less than 11 after the test is indicated by "B", whereas the case with log (IR [Ω]) of 11 or more is indicated by "A".

Further, the reasons for the failures are briefly described in the columns of "Remarks" of Tables 16 and 17 for the failed samples in this experimental example.

TABLE 16

| Sample Number | εr | Qf (GHz) | β (ppm/K) | Insulation Reliability | Remarks |
|---|---|---|---|---|---|
| 301* | — | — | — | — | Unsintered |
| 302* | — | — | — | — | Unsintered |
| 303 | 20 | 8300 | 48 | A | |
| 304 | 23 | 9600 | 36 | A | |
| 305 | 24 | 9800 | 38 | A | |
| 306* | 24 | 9000 | 51 | B | Decreased Insulation Reliability |
| 307* | 23 | 8600 | 50 | B | Decreased Insulation Reliability |
| 308 | 23 | 8200 | 46 | A | |
| 309 | 23 | 7700 | 49 | A | |
| 310 | 22 | 8200 | 48 | A | |
| 311* | 22 | 4800 | 58 | A | Decreased Qf |
| 312* | 23 | 4600 | 56 | A | Decreased Qf |
| 313 | 22 | 7700 | 46 | A | |
| 314 | 23 | 7600 | 45 | A | |
| 315 | 23 | 8900 | 41 | A | |
| 316 | 22 | 8800 | 40 | A | |
| 317 | 22 | 8700 | 48 | A | |
| 318* | — | — | — | — | Unsintered |
| 319 | 22 | 9400 | 42 | A | |
| 320* | — | — | — | — | Unsintered |
| 321 | 22 | 9400 | 39 | A | |
| 322* | — | — | — | — | Unsintered |
| 323 | 22 | 9300 | 40 | A | |
| 324* | 23 | 8100 | 44 | B | Decreased Insulation Reliability |
| 325 | 23 | 9700 | 40 | A | |
| 326 | 22 | 9500 | 39 | A | |
| 327 | 23 | 10600 | 35 | A | |
| 328 | 22 | 10200 | 42 | A | |
| 329 | 22 | 9700 | 38 | A | |
| 330 | 23 | 9200 | 36 | A | |
| 331 | 22 | 9500 | 39 | A | |
| 332 | 24 | 7700 | 42 | A | |
| 333 | 23 | 8600 | 40 | A | |
| 334 | 24 | 8800 | 52 | A | |
| 335 | 20 | 7300 | 50 | A | |
| 336 | 22 | 8400 | 46 | A | |
| 337 | 23 | 9900 | 36 | A | |
| 338 | 21 | 7600 | 50 | A | |
| 339* | 20 | 7400 | 86 | A | Deteriorated β |
| 340* | 20 | 7200 | 88 | A | Deteriorated β |
| 341* | 21 | 9200 | 54 | B | Decreased Insulation Reliability |
| 342* | 22 | 8900 | 56 | B | Decreased Insulation Reliability |
| 343* | — | — | — | — | Unvitrified |
| 344* | — | — | — | — | Unvitrified |
| 345* | 21 | 6000 | 52 | B | Decreased Insulation Reliability |
| 346* | 22 | 6200 | 55 | B | Decreased Insulation Reliability |
| 347* | 22 | 6100 | 58 | B | Decreased Insulation Reliability |
| 348* | 20 | 6200 | 55 | B | Decreased Insulation Reliability |

TABLE 17

| Sample Number | εr | Qf (GHz) | β (ppm/K) | Insulation Reliability | Remarks |
|---|---|---|---|---|---|
| 349* | — | — | — | — | Unsintered |
| 350 | 21 | 8200 | 53 | A | |
| 351 | 22 | 8600 | 48 | A | |
| 352* | 22 | 7800 | 48 | B | Decreased Insulation Reliability |
| 353* | 25 | 5500 | 50 | A | Decreased Qf |
| 354 | 25 | 8200 | 42 | A | |
| 355 | 21 | 9000 | 54 | A | |
| 356* | 21 | 8300 | 74 | A | Deteriorated β |
| 357 | 24 | 7900 | 50 | A | |
| 358 | 22 | 9000 | 55 | A | |
| 359 | 23 | 9600 | 42 | A | |
| 360 | 21 | 9100 | 44 | A | |
| 361 | 23 | 9600 | 39 | A | |
| 362 | 21 | 9200 | 40 | A | |
| 363* | 16 | 7700 | 55 | A | Decreased εr |
| 364 | 20 | 8100 | 52 | A | |
| 365 | 23 | 9600 | 47 | A | |
| 366 | 23 | 9800 | 45 | A | |
| 367* | 24 | 7800 | 50 | B | Decreased Insulation Reliability |
| 368* | 18 | 7900 | 46 | A | Decreased εr |
| 369 | 20 | 8400 | 46 | A | |
| 370 | 22 | 8000 | 46 | A | |
| 371 | 23 | 9400 | 48 | A | |
| 372 | 24 | 9300 | 48 | A | |
| 373 | 24 | 7700 | 48 | A | |
| 374* | 23 | 8100 | 50 | B | Decreased Insulation Reliability |
| 375* | 18 | 8000 | 55 | A | Decreased εr |
| 376 | 20 | 9400 | 48 | A | |
| 377 | 24 | 10300 | 38 | A | |
| 378 | 21 | 9400 | 46 | A | |
| 379 | 23 | 9700 | 42 | A | |
| 380 | 23 | 9900 | 43 | A | |
| 381* | 23 | 9000 | 44 | B | Decreased Insulation Reliability |
| 382* | — | — | — | — | Unsintered |
| 383 | 20 | 9400 | 52 | A | |
| 384 | 22 | 8900 | 55 | A | |
| 385* | 22 | 4000 | 58 | A | Decreased Qf |
| 386 | 24 | 8900 | 46 | A | |
| 387 | 22 | 8700 | 44 | A | |
| 388 | 21 | 8000 | 52 | A | |
| 389 | 21 | 7900 | 53 | A | |
| 390 | 20 | 9600 | 55 | A | |
| 391 | 23 | 9000 | 46 | A | |
| 392* | 21 | 8000 | 68 | A | Deteriorated β |
| 393 | 22 | 8400 | 50 | A | |
| 394 | 24 | 9300 | 40 | A | |
| 395* | 22 | 4500 | 55 | A | Decreased Qf |

In Tables 16 and 17, the sample numbers are marked with * for the samples determined as failures in this experimental example.

The following is determined from Tables 13 to 17.

First, the samples 301 to 348 listed in Tables 13 and 16 will be first considered. Any one of all the glass G1 to G36 listed in Table 1 was used for the samples 301 to 348. It is to be noted the content of the "glass" was made to be either "11.1 weight %" or "11.5 weight %" for the samples 301 to 348.

Samples 301 and 302 were not sufficiently sintered. This is assumed to be because of the use of the glass G1 with the $Li_2O$ content lower than 0.3 weight %.

Samples 306 and 307 decreased in insulation reliability. This is assumed to be because of the use of the glass G5 with the $Li_2O$ content higher than 7.5 weight %.

Samples 311 and 312 decreased in Qf. This is assumed to be because of the use of the glass G8 with the alkaline-earth metal content lower than 44.0 weight %.

Sample 318 was not sufficiently sintered. This is assumed to be because of the use of the glass G13 with the alkaline-earth metal content higher than 69.0 weight %.

Sample 320 was not sufficiently sintered. This is assumed to be because of the use of the glass G15 with the $B_2O_3$ content lower than 10.0 weight %.

Sample 322 was not sufficiently sintered. This is assumed to be because of the use of the glass G17 with the $SiO_2$ content higher than 30.0 weight %.

Sample 324 decreased in insulation reliability. This is assumed to be because of the use of the glass G19 with the $B_2O_3$ content higher than 20.0 weight %.

Samples 339 and 340 deteriorated in temperature coefficient of capacitance β. This is assumed to be because of the use of the glass G32 with the MgO content lower than 0.1 weight %.

Samples 341 and 342 decreased in insulation reliability. This is assumed to be because of the use of the glass G33 with the MgO content higher than 5.5 weight %.

Samples 343 and 344 were not vitrified. This is assumed to be because of the use of the glass G34 with the $SiO_2$ content lower than 14.2 weight %.

Samples 345 and 346 decreased in insulation reliability. This is assumed to be because of the use of the glass G35 with the $Al_2O_3$ content lower than 0.5 weight %.

Samples 347 and 348 decreased in insulation reliability. This is assumed to be because of the use of the glass G36 with the $Al_2O_3$ content higher than 4.0 weight %.

The samples 303 to 305, 308 to 310, 313 to 317, 319, 321, 323, and 325 to 338 shown in Tables 13 and 16, other than samples 301, 302, 306, 307, 311, 312, 318, 320, 322, 324, and 339 to 348 mentioned above, achieved favorable results of Qf: 7000 GHz or higher, β: 60 ppm/K or lower in terms of absolute value, and insulation reliability: 11 or more in log (IR [Ω]), even with $\in_r$ in the range of 20 to 25.

This is assumed to be because of the use of any one of the glass G2, G3, G4, G6, G7, G9, G10, G11, G12, G14, G16, G18, G20, G21, G22, G23, G24, G25, G26, G27, G28, G29, G30, and G31 which satisfy the conditions of: the alkaline-earth metal content of 44.0 to 69.0 weight %; the $SiO_2$ content of 14.2 to 30.0 weight %; the $B_2O_3$ content of 10.0 to 20.0 weight %; the $Al_2O_3$ content of 0.5 to 4.0 weight %; the $Li_2O$ content of 0.3 to 7.5 weight %; and the MgO content of 0.1 to 5.5 weight %.

Next, the samples 349 to 395 listed in Tables 14 and 15 as well as Table 17 will be first considered. For the samples 349 to 395, the respective contents of "Glass", "First Ceramic", "Second Ceramic", "MnO", "CuO", "$Mg_2Al_4Si_5O_{18}$", and "$BaAl_2Si_2O_8$" were varied while the glass G22 shown in Table 1 was used as the "Glass".

Sample 349 was not sufficiently sintered. This is assumed to be because the glass content was lower than 7 weight %.

Sample 352 decreased in insulation reliability. This is assumed to be because the glass content was higher than 20 weight %.

Sample 353 decreased in Qf. This is assumed to be because the content of $MgAl_2O_4$ or $Mg_2SiO_4$ as the first ceramic was lower than 15.5 weight %.

Sample 356 deteriorated in temperature coefficient of capacitance β. This is assumed to be because the content of $MgAl_2O_4$ or $Mg_2SiO_4$ as the first ceramic was higher than 47 weight %.

Sample 363 resulted in $\in_r$ less than 20. This is assumed to be because the BaO content was lower than 2.1 weight % in the second ceramic.

Sample 367 decreased in insulation reliability. This is assumed to be because the BaO content was higher than 5.2 weight % in the second ceramic.

Sample 368 resulted in $\in_r$ less than 20. This is assumed to be because the $TiO_2$ content was lower than 9.5 weight % in the second ceramic.

Sample 374 decreased in insulation reliability. This is assumed to be because the $TiO_2$ content was higher than 24.75 weight % in the second ceramic.

Sample 375 resulted in $\in_r$ less than 20. This is assumed to be because the content of $Nd_2O_3$ as $RE_2O_3$ was lower than 13.2 weight % in the second ceramic.

Sample 381 decreased in insulation reliability. This is assumed to be because the content of $Nd_2O_3$ as $RE_2O_3$ was higher than 34.75 weight % in the second ceramic.

Sample 382 was not sufficiently sintered. This is assumed to be because the MnO content was lower than 5.5 weight %.

Sample 385 decreased in Qf. This is assumed to be because the MnO content was higher than 20.5 weight %.

Sample 392 deteriorated in temperature coefficient of capacitance β. This is assumed to be because the content of the third ceramic including at least one of $Mg_2Al_4Si_5O_{18}$ and $BaAl_2Si_2O_8$ was higher than 7.5 weight %.

Sample 395 decreased in Qf. This is assumed to be because the CuO content was higher than 1.2 weight %.

The samples 350, 351, 354, 355, 357 to 362, 364 to 366, 369 to 373, 376 to 380, 383, 384, 386 to 391, 393, and 394 shown in Tables 14 and 15 as well as Table 17, other than samples 349, 352, 353, 356, 363, 367, 368, 374, 375, 381, 382, 385, 392, and 395 mentioned above, achieved favorable results of Qf: 7000 GHz or higher, β: 60 ppm/K or lower in terms of absolute value, and insulation reliability: 11 or more in log (IR [Ω]), even with $\in_r$ in the range of 20 to 25.

This is assumed to be because of the satisfied conditions of: first ceramic content of 15.5 to 47 weight %; glass content of 7 to 20 weight %; MnO content of 5.5 to 20.5 weight %; BaO content of 2.1 to 5.2 weight %; $RE_2O_3$ content of 13.2 to 34.75 weight %; $TiO_2$ content of 9.5 to 24.75 weight %; CuO content of 1.2 weight % or less; and the third ceramic content of 7.5 weight % or less, which includes at least one of $Mg_2Al_4Si_5O_{18}$ and $BaAl_2Si_2O_8$.

It is to be noted that while $Nd_2O_3$ and $Sm_2O_3$ were used as $RE_2O_3$ in the second ceramic in Experimental Example 4, it has been confirmed that similar tendencies are also shown when other rare-earth elements are used.

DESCRIPTION OF REFERENCE SYMBOLS

1,1a ceramic multilayer module
2,2a multilayer ceramic substrate
3 ceramic layer
4 low-dielectric-constant ceramic layer
5 high-dielectric-constant ceramic layer
21 LC filter
23 component main body
28~40 ceramic green sheet

The invention claimed is:

1. A glass ceramic composition comprising:
   (1) a first ceramic comprising at least one of $MgAl_2O_4$ and $Mg_2SiO_4$;
   (2) a second ceramic comprising BaO, $RE_2O_3$, and $TiO_2$;
   (3) glass containing each of 44.0 to 69.0 weight % of RO, 14.2 to 30.0 weight % of $SiO_2$, 10.0 to 20.0 weight % of $B_2O_3$, 0.5 to 4.0 weight % of $Al_2O_3$, 0.3 to 7.5 weight % of $Li_2O$, and 0.1 to 5.5 weight % of MgO; and
   (4) MnO,
   wherein RE is a rare-earth element, and R is at least one alkaline-earth metal selected from Ba, Ca, and Sr.

2. The glass ceramic composition according to claim 1, comprising:
   47.55 to 69.32 weight % of the first ceramic,
   6 to 20 weight % of the glass,
   7.5 to 18.5 weight % of the MnO, and
   as the second ceramic, each of 0.38 to 1.43 weight % of BaO, 1.33 to 9.5 weight % of $RE_2O_3$, and 0.95 to 6.75 weight % of $TiO_2$.

3. The glass ceramic composition according to claim 2, further comprising 0.23 weight % or less of CuO.

4. The glass ceramic composition according to claim 2, further comprising a third ceramic comprising at least one of $Mg_2Al_4Si_5O_{18}$ and $BaAl_2Si_2O_8$ at 3 to 20 weight %.

5. The glass ceramic composition according to claim 4, further comprising 0.3 weight % or less of CuO.

6. The glass ceramic composition according to claim 2, further comprising a third ceramic comprising at least one of $Mg_2Al_4Si_5O_{18}$ and $BaAl_2Si_2O_8$.

7. The glass ceramic composition according to claim 6, further comprising 0.3 weight % or less of CuO.

8. The glass ceramic composition according to claim 1, comprising:
 1 to 15 weight % of the first ceramic,
 3 to 15 weight % of the glass,
 2.3 to 10 weight % of the MnO, and
 as the second ceramic, each of 2.5 to 15.7 weight % of BaO, 24.6 to 65.3 weight % of $RE_2O_3$, and 11.2 to 36.4 weight % of $TiO_2$.

9. The glass ceramic composition according to claim 8, further comprising 1.2 weight % or less of CuO.

10. The glass ceramic composition according to claim 1, comprising:
 15.5 to 47 weight % of the first ceramic,
 7 to 20 weight % of the glass,
 5.5 to 20.5 weight % of the MnO, and
 as the second ceramic, each of 2.1 to 5.2 weight % of BaO, 13.2 to 34.75 weight % of $RE_2O_3$, and 9.5 to 24.75 weight % of $TiO_2$.

11. The glass ceramic composition according to claim 10, further comprising 1.2 weight % or less of CuO.

12. The glass ceramic composition according to claim 11, further comprising a third ceramic comprising at least one of $Mg_2Al_4Si_5O_{18}$ and $BaAl_2Si_2O_8$ at 7.5 weight % or less.

13. The glass ceramic composition according to claim 10, further comprising a third ceramic comprising at least one of $Mg_2Al_4Si_5O_{18}$ and $BaAl_2Si_2O_8$ at 7.5 weight % or less.

14. The glass ceramic composition according to claim 10, further comprising a third ceramic comprising at least one of $Mg_2Al_4Si_5O_{18}$ and $BaAl_2Si_2O_8$.

* * * * *